US 6,576,847 B2
Jun. 10, 2003

(12) United States Patent
Marketkar et al.

(54) CLAMP TO SECURE CARRIER TO DEVICE FOR ELECTROMAGNETIC COUPLER

(75) Inventors: Nandu J. Marketkar, Boylston, MA (US); Mark E. Naylor, Franklin, MA (US); John L. Critchlow, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 09/751,442

(22) Filed: Dec. 29, 2000

(65) Prior Publication Data

US 2003/0042031 A1 Mar. 6, 2003

Related U.S. Application Data

(63) Continuation-in-part of application No. 09/713,702, filed on Nov. 15, 2000, which is a continuation-in-part of application No. 09/318,287, filed on May 25, 1999.

(51) Int. Cl.$^7$ .................................................. H05K 1/02
(52) U.S. Cl. ................. 174/255; 257/727; 333/24 R; 361/807
(58) Field of Search ................. 174/250, 255; 257/726, 727; 361/752, 807; 248/74.2; 333/24 R, 125, 136; 343/713

(56) References Cited

U.S. PATENT DOCUMENTS

| | | |
|---|---|---|
| 3,516,065 A | 6/1970 | Bolt et al. |
| 3,619,504 A | 11/1971 | De Veer et al. |
| 3,740,675 A | 6/1973 | Moore et al. |
| 3,755,764 A * | 8/1973 | Suzuki ..................... 248/74.2 |
| 4,654,843 A | 3/1987 | Roza et al. |
| 4,819,001 A * | 4/1989 | Ohe et al. ................... 343/713 |
| 4,838,797 A | 6/1989 | Dodier |
| 4,876,535 A | 10/1989 | Ballmer et al. |

(List continued on next page.)

OTHER PUBLICATIONS

U.S. patent application No. 09/318,287, filed May 25, 1999, entitled High–Speed Digital Distribution System, by Thomas F. Knight, Jr. and Nandu J. Marketkar.
Farjad–Rad, Ramin, et al., "A 0.3–μm CMOS 8–Gb/s 4–PAM Serial Link Transceiver", IEEE Journal of Solid–State Circuits, vol. 35, No. 5, pp. 757–764 (May 2000).
Osaka, Hideki, High Performance Memory Interface for DDR–SDRAM II: XTL (Crosstalk Transfer Logic), Hitachi Ltd., Systems Development Laboratory, pp. 1–20 (Sep. 15, 2000).
Stearns, Thomas H., Flexible Printed Circuitry, McGraw–Hill Companies, Inc., pp. 109–110 and 232–235 (1996).
XTL Evaluation System, Hitachi Ltd., Systems Development Laboratory, pp. 1–14 (Sep. 15, 2000).
Yang, Chih–Kong Ken, et al., "A 0.5–μm CMOS 4.0–Gbit/s Serial Link Transceiver with Data Recovery Using Oversampling", IEEE Journal of Solid–State Circuits, vol. 33, No. 5, pp. 713–722 (May 1998).
U.S. patent application No. 09/713,702, filed Nov. 15, 2000, entitled Interconnect Mechanics for Electromagnetic Coupler, by Nandu J. Marketkar, Thomas F. Knight, Jr., John R. Benham, Mark E. Naylor and John L. Critchlow.
U.S. patent application No. 09/751,527, filed Dec. 29, 2000, entitled Electromagnetic Coupler Socket, by Nandu J. Marketkar, Thomas F. Knight, Jr., Mark E. Naylor and John L. Critchlow.
U.S. patent application No. 09/751,526, filed Dec. 29, 2000, entitled Electromagnetic Coupler Alignment, by Nandu J. Marketkar and Thomas F. Knight, Jr.

*Primary Examiner*—Albert W. Paladini
(74) *Attorney, Agent, or Firm*—Blakley, Sokoloff, Taylor & Zafman LLP

(57) ABSTRACT

A device comprises a component having circuitry, a carrier comprising one or more conductive areas to form a portion of an electromagnetic coupler, and a clamp to secure the carrier to the device.

31 Claims, 14 Drawing Sheets

U.S. PATENT DOCUMENTS

| | | |
|---|---|---|
| 4,969,824 A | 11/1990 | Casciotti |
| 5,073,761 A | 12/1991 | Waterman et al. |
| 5,171,154 A | 12/1992 | Casciotti et al. |
| 5,197,888 A | 3/1993 | Brodsky et al. |
| 5,308,249 A | 5/1994 | Renn et al. |
| 5,315,617 A | 5/1994 | Guida et al. |
| 5,385,476 A | 1/1995 | Jasper |
| 5,432,486 A | 7/1995 | Wong |
| 5,470,240 A | 11/1995 | Suzuki |
| 5,629,838 A | 5/1997 | Knight et al. |
| 5,638,402 A | 6/1997 | Osaka et al. |
| 5,667,388 A | 9/1997 | Cottrell |
| 5,793,668 A | 8/1998 | Krakovyak |
| 5,838,727 A | 11/1998 | Lyon et al. |
| 5,844,213 A * | 12/1998 | Peysakhovich et al. ..... 219/647 |
| 5,945,634 A * | 8/1999 | Shimirak et al. ......... 333/24 R |
| 5,977,841 A | 11/1999 | Lee et al. |
| 6,005,895 A | 12/1999 | Perino et al. |
| 6,007,357 A | 12/1999 | Perino et al. |
| 6,039,595 A | 3/2000 | Tseng et al. |
| 6,218,916 B1 | 4/2001 | Ishikawa et al. |
| 6,281,848 B1 | 8/2001 | Nagumo et al. |
| 6,333,719 B1 | 12/2001 | Varadan et al. |
| 2001/0024888 A1 | 9/2001 | Marketkar et al. |

* cited by examiner

CLAMP TO SECURE CARRIER TO DEVICE FOR ELECTROMAGNETIC COUPLER

This patent application is a continuation-in-part patent application of U.S. patent application Ser. No. 09/713,702, filed Nov. 15, 2000, entitled INTERCONNECT MECHANICS FOR ELECTROMAGNETIC COUPLER, which is a continuation in part patent application of U.S. patent application Ser. No. 09/318,287, filed May. 25, 1999, entitled HIGH-SPEED SPEED DIGITAL DISTRIBUTION SYSTEM.

BACKGROUND OF THE INVENTION

1. Field of the Invention

The present invention relates generally to the field of electronic systems. More particularly, the present invention relates to the field of coupling of signals for communication in electronic systems.

2. Description of Related Art

A typical multidrop signal distribution system comprises a device at one end of a bus and multiple devices electrically coupled to that bus by a respective coupling requiring direct metal to metal contact. Each device along the bus, however, acts electrically as a lumped capacitive load on the bus, lowering both line impedance and signal propagation speed on the bus. As a result, such a system experiences increased power dissipation, requires increased power to drive the bus in order to achieve a desired signal-to-noise ratio, and experiences increased delays for signal reception at distant points along the bus.

The lumped capacitive loads also cause impedance discontinuities and reflections for signals transmitted at relatively high frequencies. In practice, such a system may only use a relatively short bus as compared to the wavelength of the fundamental frequency transmitted over the bus. Such a system may therefore transmit only relatively low frequency, and therefore relatively long wavelength, signals.

BRIEF DESCRIPTION OF THE DRAWINGS

The present invention is illustrates by way of example and not limitation in the figures of the accompanying drawings, in which like references indicate similar elements and in which.

DETAILED DESCRIPTION

The following detailed description sets forth an embodiment or embodiments in accordance with the present invention for interconnect mechanics for electromagnetic coupler. In the following description, details are set forth such as specific dimensions, materials, etc. in order to provide a thorough understanding of the present invention. It will be evident, however, that the present invention may be practiced without these details. In other instances, well-known computer and electronic components, etc. have not been described in particular detail so as not to obscure the present invention.

EXEMPLARY SYSTEM

Figure 1:
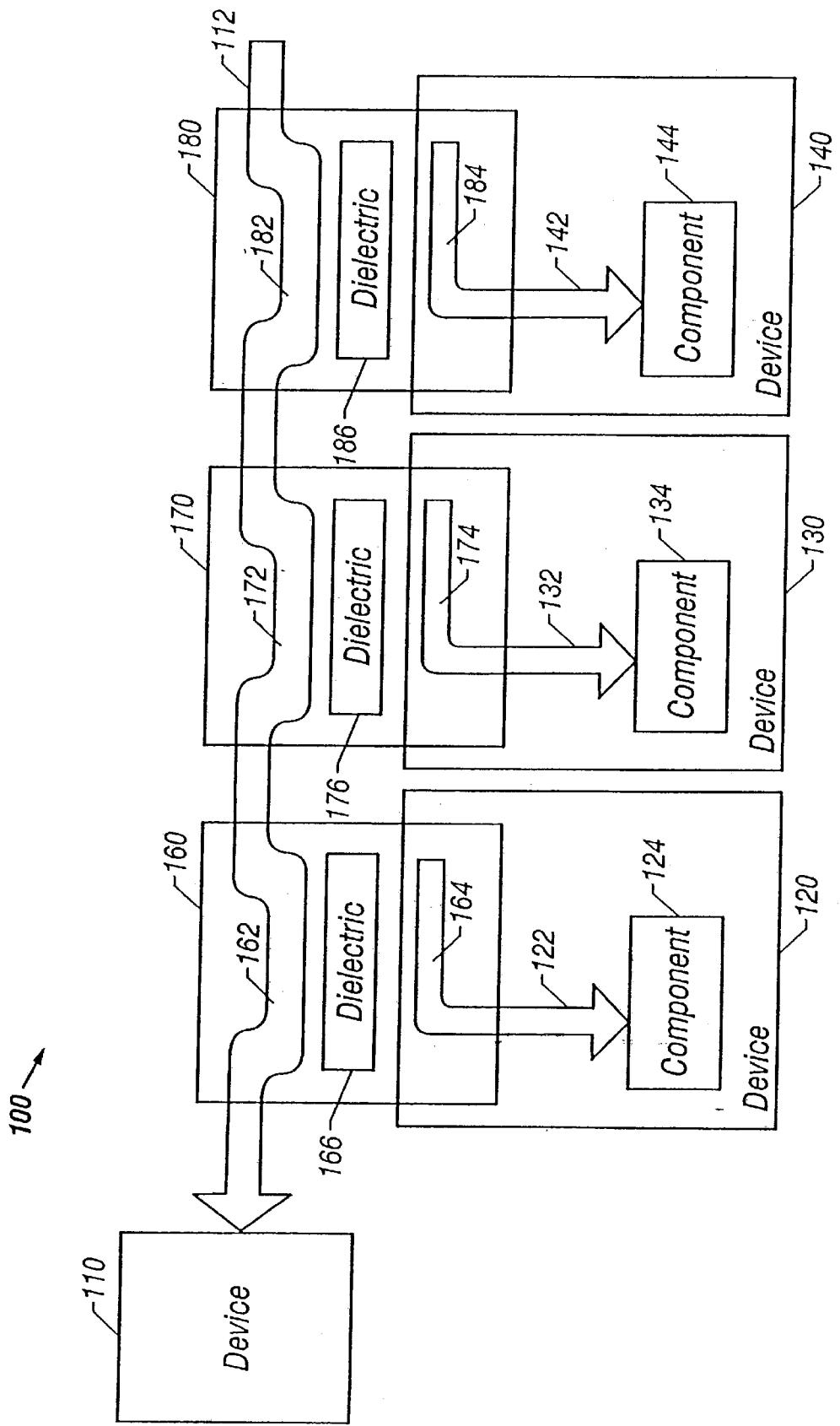
FIG. 1 illustrates in block diagram form an exemplary multi-drop signal distribution system in which a device is electromagnetically coupled to other devices by respective electromagnetic couplers.

FIG. 1 illustrates in block diagram form an exemplary multi-drop signal distribution system 100 comprising a device 110 and other devices 120, 130, and 140. Device 110 has a bus 112 coupled to device 110. Devices 120, 130, and 140 each comprise a bus 122, 132, and 142, respectively, and a component 124, 134, and 144, respectively. Buses 122, 132, and 142 are coupled to components 124, 134, and 144, respectively.

Devices 120, 130, and 140 are each electromagnetically coupled to bus 112 by an electromagnetic coupler 160, 170, and 180, respectively. Electromagnetic couplers 160, 170, and 180 electromagnetically couple buses 122, 132, and 142, respectively, to bus 112, allowing components 124, 134, and 144, respectively, to communicate with device 110. Electromagnetically coupling each device 120, 130, and 140 to bus 112 forms a data channel having substantially uniform electrical properties for transferring signals among devices 110, 120, 130, and 140 and allows use of relatively high frequency signaling without significantly increasing noise attributable to transmission line effects.

Although illustrates with three devices 120, 130, and 140 electromagnetically coupled to bus 112, bus 112 may have any suitable length and may accommodate any suitable number of devices to be electromagnetically coupled to bus 112. For one embodiment, bus 112 is approximately 50 centimeters (cm) in length, allowing up to 16 devices each to be electromagnetically coupled along approximately 1 cm of the length of bus 112 with each device spaced on a pitch of approximately 1.5 cm.

Each device 120, 130, and 140 may be fixedly coupled to bus 112 or, alternatively, may be removably coupled to bus 112. As devices 120, 130, and 140 are electromagnetically coupled to bus 112, each device 120, 130, and 140 may be added to or removed from bus 112 with minimized effect on the communication bandwidth of bus 112.

Buses 112, 122, 132, and 142 may each comprise any suitable number of lines of any suitable conductive material. Devices 110, 120, 130, and 140 may each comprise any suitable circuitry to perform any suitable function. As one example, device 110 may comprise a memory controller and devices 120, 130, and 140 may each comprise a memory module for example. Devices 110, 120, 130, and 140 may communicate over buses 112, 122, 132, and 142 using any suitable signaling scheme. Each device 110, 120, 130, and 140 for one embodiment communicates using differential signal pairs to help minimize power and electromagnetic interference (EMI) and to help increase noise immunity.

Each component 122, 132, and 142 may comprise any suitable circuitry. Each component 122, 132, and 142 for one embodiment serves as an interface for each device 120, 130, and 140 to communicate with device 110.

Although illustrates in multi-drop signal distribution system 100, each device 120, 130, and 140 for another embodiment may communicate with device 110 in a point-to-point manner by electromagnetically coupling each device 120, 130, and 140 to a respective bus coupled to device 110.

ELECTROMAGNETIC COUPLER

For one embodiment, as illustrates in FIG. 1, electromagnetic coupler 160 is formed by a portion 162 of the length of bus 112, a portion 164 of the length of bus 122, and a dielectric 166 between portions 162 and 164. Electromagnetic coupler 170 is formed by a portion 172 of the length of bus 112, a portion 174 of the length of bus 132, and a dielectric 176 between portions 172 and 174. Electromagnetic coupler 180 is formed by a portion 182 of the length of bus 112, a portion 184 of the length of bus 142, and a dielectric 186 between portions 182 and 184. Each dielectric 166, 176, and 186 may comprise any suitable dielectric material such as, without limitation, air, various polyimides, various epoxies, various polymeric materials, various plastics, various ceramics, polyethylene terephthalate (PET), polytetrafluoroethylene (PTFE) such as Teflon® by E.I. du Pont de Nemours and Company of Wilmington, Delaware, RT/Duroid® by World Properties, Inc. of Lincolnwood, Illinois, and/or alumina, for example. Each electromagnetic coupler 160, 170, and 180 may be formed to have any suitable coupling coefficient, such as in the range of approximately 0.15 to approximately 0.45 for example.

Figure 2:
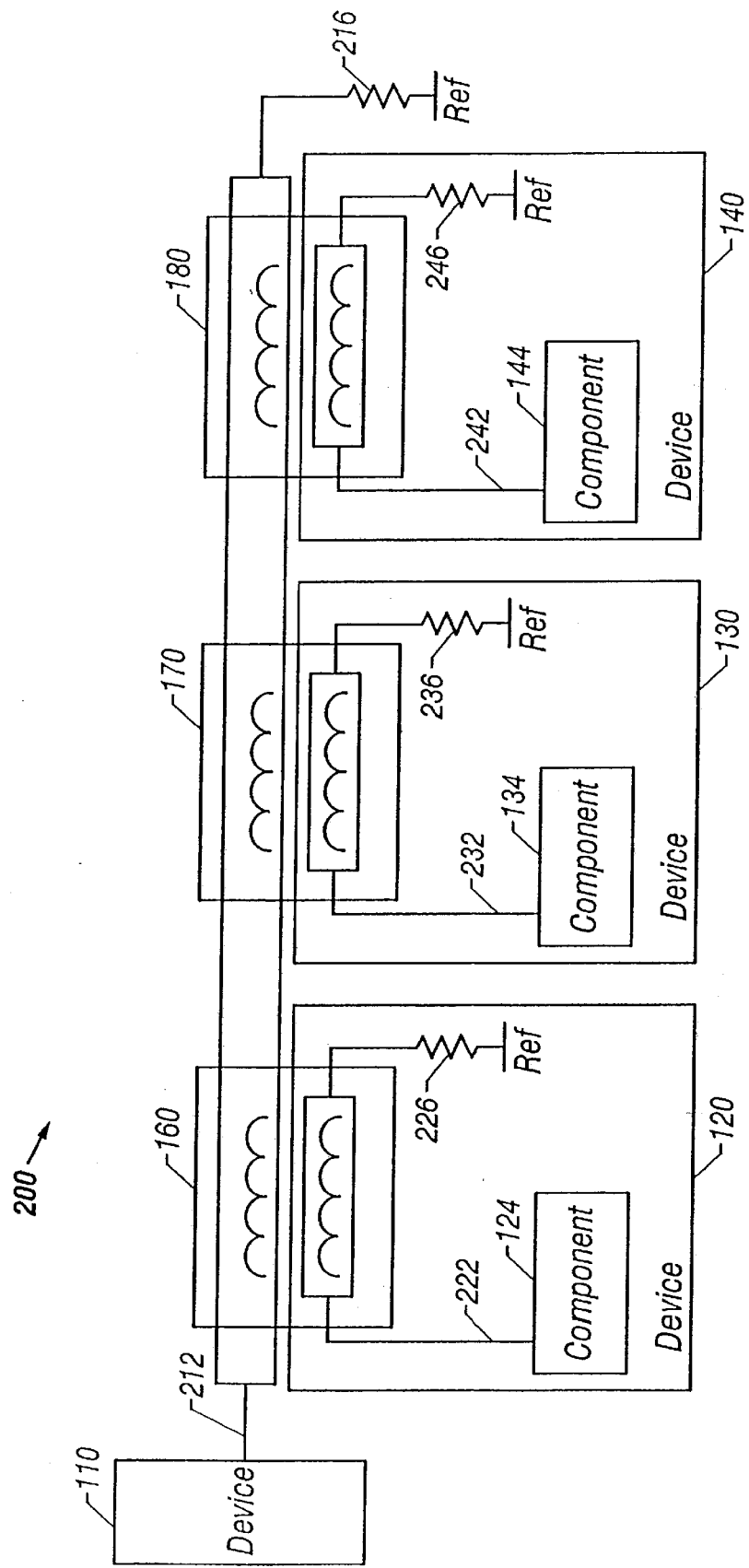
FIG. 2 illustrates, for one embodiment, an electrical model of the electromagnetic couplers of FIG. 1.

FIG. 2 illustrates, for one embodiment, an electrical model 200 for electromagnetic coupler 160 coupling a single conductive line 212 of bus 112 and a single conductive line 222 of bus 122, for electromagnetic coupler 170 coupling line 212 of bus 112 and a single conductive line 232 of bus 132, and for electromagnetic coupler 180 coupling line 212 of bus 112 and a single conductive line 242 of bus 142.

Line 212 is terminated with a parallel resistor 216 coupled between the end of line 212 distant from device 110 and a suitable voltage reference, such as ground for example. Resistor 216 for one embodiment has a resistance approximately equal to the characteristic impedance of line 212. Line 222 is terminated with a parallel resistor 226 coupled between the end of line 222 distant from device 120 and a voltage reference. Resistor 226 has a resistance approximately equal to the characteristic impedance of line 222. Line 232 is terminated with a parallel resistor 236 coupled between the end of line 232 distant from device 130 and a voltage reference. Resistor 236 has a resistance approximately equal to the characteristic impedance of line 232. Line 242 is terminated with a parallel resistor 246 coupled between the end of line 242 distant from device 140 and a voltage reference. Resistor 246 has a resistance approximately equal to the characteristic impedance of line 242. Lines 212, 222, 232, and 242 are each terminated with a matched impedance for transmitting relatively high frequency signals.

As device 110 transmits a signal on line 212, a corresponding signal is induced on lines 222, 232, and 242 through electromagnetic coupler 160, 170, and 180, respectively, due to the electromagnetic fields generated by driving the signal on line 212. Similarly, as component 124, 134, or 144 transmits a signal on line 222, 232, or 242, respectively, a corresponding signal is induced on line 212.

Lines 222, 232, and 242 each absorb only a fraction of the power of a corresponding signal driven on line 212. Each line 222, 232, and 242 terminates the received power using resistor 226, 236, and 246, respectively. Similarly, line 212 absorbs only a fraction of the power of a corresponding signal driven on line 222, 232, and 242. Line 212 terminates the received power using resistor 216. Each electromagnetic coupler 160, 170, and 180 may absorb any suitable amount of power depending, for example, on the amount of driven power and the coupling coefficient of the electromagnetic coupler. Each electromagnetic coupler 160, 170, and 180 for one embodiment absorbs less than approximately one percent of the power of a signal driven on any line coupled to the electromagnetic coupler. Because any capacitive load of devices 120, 130, and 140 and their respective lines 222, 232, and 242 are isolated from one another and from line 212, a generally constant impedance environment may be maintained on line 212 and any disturbance or impact of communication system parasitics on lines 212, 222, 232, and 242 is minimized or avoided.

Bus 112 for one embodiment is mounted on or integrated in a circuit board, and device 110 is mounted to or otherwise coupled to the circuit board such that device 110 is electrically coupled to bus 112. Each electromagnetic coupler 160, 170, and 180 is formed by positioning bus portions 164, 174, and 184, respectively, relative to bus portions 162, 172, and 182 with dielectric 166, 176, and 186 between the electromagnetically coupled portions.

CIRCUIT BOARD AND FLEX CIRCUIT

Figure 3:
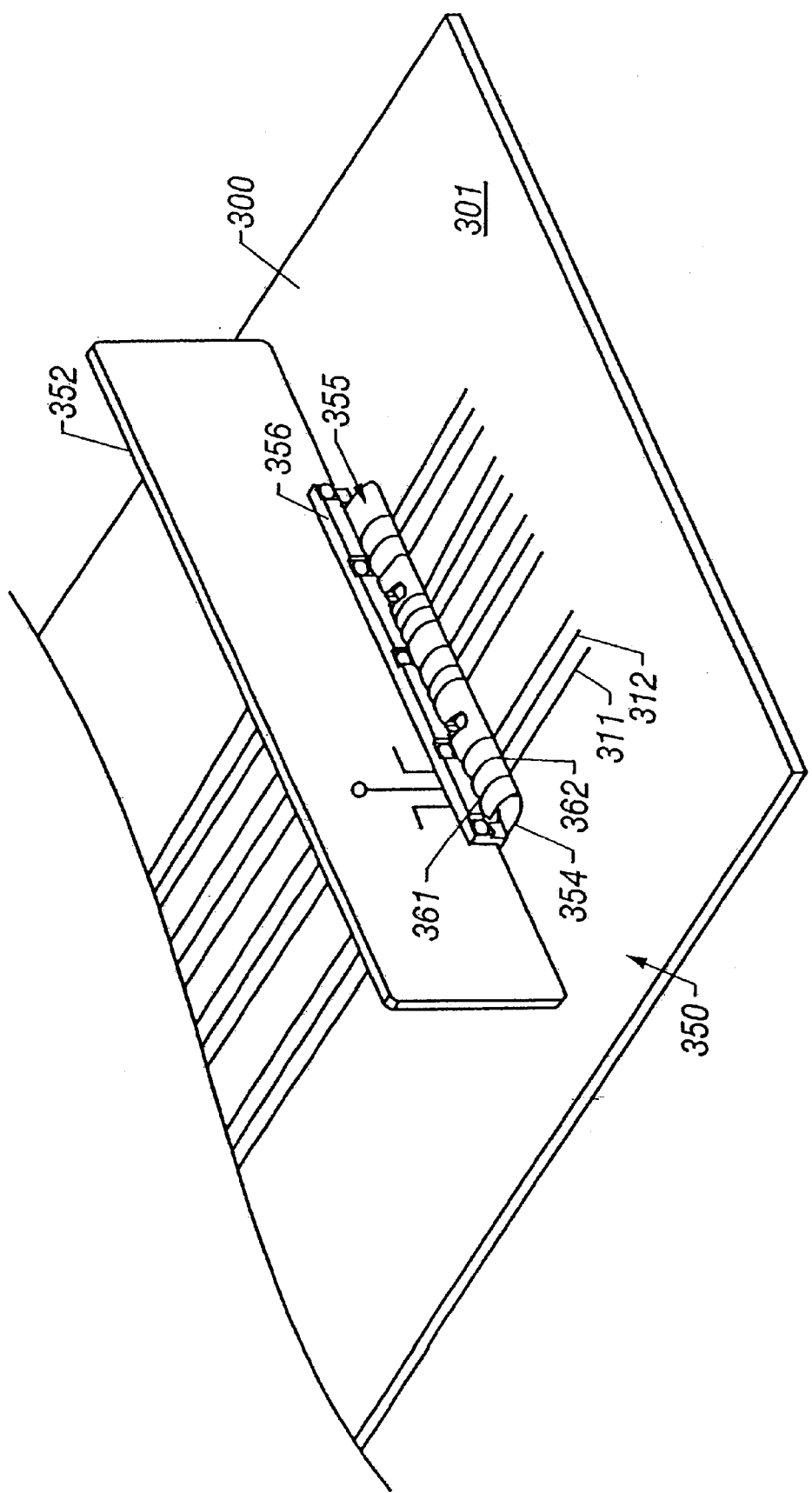
FIG. 3 illustrates, for one embodiment, a device electromagnetically coupled to a circuit board.

Each device 120, 130, and 140 may be implemented in any suitable manner, such as that of device 350 of FIG. 3 for example, to form electromagnetic couplers 160, 170, and 180, respectively. As illustrates in FIG. 3, device 350 is electromagnetically coupled to a circuit board 300 and comprises a circuit board 352, a flex circuit 354, and a clamp 356 to secure flex circuit 354 to circuit board 352. Circuit board 300 and circuit board 352 may each comprise any suitable circuitry. For one embodiment, circuit board 300 is a mother board, and circuit board 352 is a daughter board.

Circuit board 300 has conductive lines, such as conductive lines 311 and 312 for example, for bus 112, for example. Flex circuit 354 has conductive lines, such as conductive lines 361 and 362 for example, which form at least a portion of bus 122, for example. Conductive lines of circuit board 300 each include a respective conductive area to be positioned relative to a corresponding conductive area of a respective conductive line of flex circuit 354 with dielectric 166, for example, between such corresponding conductive areas to form electromagnetic coupler 160, for example. Corresponding conductive areas, such as those for conductive lines 311 and 361 for example, may be positioned by positioning a surface 355 of flex circuit 354 relative to a surface 301 of circuit board 300. For one embodiment, conductive lines of flex circuit 354 are each positioned relative to a respective corresponding conductive line of circuit board 300 with dielectric 166 between each pair of corresponding conductive lines along at least a portion of the length of each conductive line in each pair to form electromagnetic coupler 160. For one embodiment, electromagnetic coupler 160 is formed with approximately one centimeter (cm) in length of each conductive line in each pair.

Dielectric 166 between each conductive area may comprise any suitable dielectric material of any suitable thickness. Dielectric 166 for one embodiment may comprise one or more layers each comprising a suitable dielectric material. Circuit board 300 and/or flex circuit 354 may each comprise at least a portion of dielectric 166. Circuit board 300 or flex circuit 354 may comprise dielectric 166. Circuit board 300 and flex circuit 354 for one embodiment may each comprise a portion of dielectric 166.

Figure 4:
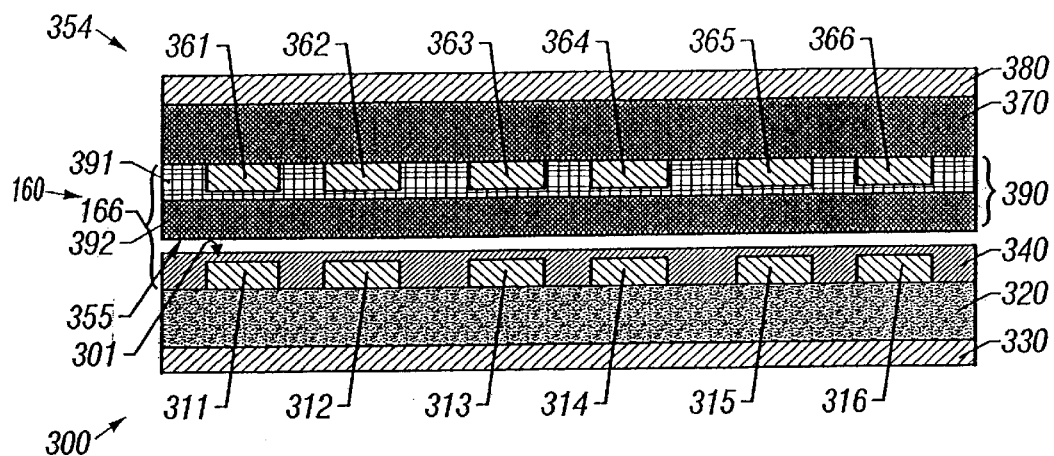
FIG. 4 illustrates, for one embodiment, a partial cross-sectional view of an electromagnetic coupler formed by the device and circuit board of FIG. 3.

FIG. 4 illustrates, for one embodiment, a partial cross-sectional view of circuit board 300 comprising a conductive layer comprising conductive lines 311, 312, 313, 314, 315, and 316 for bus 112, for example, and of flex circuit 354 comprising a conductive layer comprising conductive lines 361, 362, 363, 364, 365, and 366 for bus 122, for example. Each conductive line 361–366 is positioned relative to each conductive line 311–316 with dielectric 166 between each pair of corresponding conductive lines 311 and 361, 312 and 362, 313 and 363, 314 and 364, 315 and 365, and 316 and 366 to form electromagnetic coupler 160.

As illustrates in FIG. 4, circuit board 300 for one embodiment comprises a dielectric layer 320, a voltage reference layer 330, and a dielectric layer 340. Dielectric layer 320 is between voltage reference layer 330 and the conductive layer comprising conductive lines 311–316. Voltage reference layer 330 helps reduce electromagnetic interference (EMI) that may be generated by signals propagating through conductive lines 311–316. Dielectric layer 320 electrically insulates conductive lines 311–316 from voltage reference layer 330. The conductive layer comprising conductive lines 311–316 is between at least a portion of dielectric layer 320 and at least a portion of dielectric layer 340. Dielectric layer 340 lies adjacent to the conductive layer comprising conductive lines 311–316 opposite dielectric layer 320. Dielectric layer 340 forms at least a portion of dielectric 166 for electromagnetic coupler 160.

Dielectric layer 320 may comprise any suitable dielectric or electrically insulating material and may comprise one or more layers of a suitable dielectric material. Dielectric layer 320 for one embodiment comprises a material that is also relatively rigid, such as a fiberglass epoxy material for example. One suitable material is known as Flame Retardant 4 (FR4). Dielectric layer 320 may have any suitable thickness. For one embodiment where dielectric layer 320 comprises FR4, dielectric layer 320 may have a thickness of approximately 5.0 mils, for example.

Each conductive line 311–316 is positioned on a surface of dielectric layer 320. Conductive lines 311–316 may each comprise any suitable conductive material, such as copper (Cu), a conductive plastic, or a printed conductive ink for example. Conductive lines 311–316 may each comprise one or more layers of a suitable conductive material. Each conductive line 311–316 may have any suitable thickness. For one embodiment where each conductive line 311–316 comprises copper (Cu), each conductive line 311–316 may have a thickness of approximately 2.0 mils, for example.

Voltage reference layer 330 is positioned on a surface of dielectric layer 320 opposite conductive lines 311–316. Voltage reference layer 330 may comprise any suitable conductive material, such as copper (Cu) or a conductive plastic for example, and may comprise one or more layers of a suitable conductive material. Voltage reference layer 330 may have any suitable thickness. For one embodiment where voltage reference layer 330 comprises copper (Cu), voltage reference layer 330 may have a thickness of approximately 1.4 mils, for example.

Dielectric layer 340 lies adjacent to the conductive layer comprising conductive lines 311–316 and portions of the surface of dielectric layer 320 exposed by conductive lines 311–316. Dielectric layer 340 may comprise any suitable dielectric material, such as an epoxy dielectric soldermask for example, and may comprise one or more layers of a suitable dielectric material. Dielectric layer 340 may have any suitable thickness. For one embodiment where dielectric fief layer 340 comprises an epoxy dielectric soldermask, dielectric layer 340 may have a thickness of approximately 1.0 mils, for example, to approximately 1.5 mils, for example. Although illustrates as having a relatively flat surface 301, surface 301 may be contoured due to conductive lines 311–316.

Circuit board 300 may be manufactured in any suitable manner using any suitable techniques.

Flex circuit 354 for one embodiment, as illustrates in FIG. 4, comprises a dielectric layer 370, a voltage reference layer 380, and a dielectric layer 390. Dielectric layer 370 is between voltage reference layer 380 and the conductive layer comprising conductive lines 361–366. Voltage reference layer 380 helps reduce electromagnetic interference (EMI) that may be generated by signals propagating through conductive lines 361–366. Dielectric layer 370 electrically insulates conductive lines 361–366 from voltage reference layer 380. The conductive layer comprising conductive lines 361–366 is between at least a portion of dielectric layer 370 and at least a portion of dielectric layer 390. Dielectric layer 390 lies adjacent to the conductive layer comprising conductive lines 361–366 opposite dielectric layer 370. Dielectric layer 390 forms at least a portion of dielectric 166 for electromagnetic coupler 160.

Dielectric layer 370 may comprise any suitable dielectric or electrically insulating material and may comprise one or more layers of a suitable dielectric material. Dielectric layer 370 for one embodiment comprises a material that is also relatively flexible and/or resilient, such as an epoxy dielectric material or a polyimide for example. One suitable polyimide is known as Kapton® by E.I. du Pont de Nemours and Company of Wilmington, Del. Another suitable material may be polyethylene terephthalate (PET). Dielectric layer 370 may have any suitable thickness. For one embodiment where dielectric layer 370 comprises Kapton®, dielectric layer 370 may have a thickness of approximately 4.0 mils, for example.

Each conductive line 361–366 is positioned on a surface of dielectric layer 370. Conductive lines 361–366 may each comprise any suitable conductive material, such as copper (Cu), a conductive plastic, or a printed conductive ink for example. Conductive lines 361–366 may each comprise one or more layers of a suitable conductive material. Each conductive line 361–366 may have any suitable thickness. For one embodiment where each conductive line 361–366 comprises copper (Cu), each conductive line 361–366 may have a thickness of approximately 0.65 mils, for example.

Voltage reference layer 380 is positioned on a surface of dielectric layer 370 opposite conductive lines 361–366. Voltage reference layer 380 may comprise any suitable conductive material, such as copper (Cu) or a conductive plastic for example, and may comprise one or more layers of a suitable conductive material. Voltage reference layer 380 may have any suitable thickness. For one embodiment where voltage reference layer 380 comprises copper (Cu), voltage reference layer 380 may have a thickness of approximately 0.65 mils, for example.

Dielectric layer 390 lies adjacent to the conductive layer comprising conductive lines 361–366 and portions of the surface of dielectric layer 370 exposed by conductive lines 361–366. Dielectric layer 390 may comprise any suitable dielectric material. Dielectric layer 390 for one embodiment comprises a material that is also relatively flexible and/or resilient, such as an epoxy dielectric material or a polyimide for example. One suitable polyimide is Kapton®. Another suitable material may be a suitable polymeric material or polyethylene terephthalate (PET). Dielectric layer 390 may have any suitable thickness. Although illustrates as having a relatively flat surface 355, surface 355 may be contoured due to conductive lines 361–366.

Dielectric layer 390 for one embodiment, as illustrates in FIG. 4, comprises a layer 391 comprising a suitable acrylic or epoxy adhesive dielectric material and another layer 392 comprising a suitable polyimide, such as Kapton® for example. Layer 391 lies adjacent to the conductive layer comprising conductive lines 361–366 and portions of the surface of dielectric layer 370 exposed by conductive lines 361–366. Layer 392 lies adjacent to layer 391. Layers 391 and 392 may each have any suitable thickness. Layer 391 for one embodiment may have a thickness of approximately 0.5 mils, for example. For one embodiment where layer 392 comprises Kapton®, layer 392 may have a thickness of approximately 0.5 mils, for example.

Flex circuit 354 may be manufactured in any suitable manner using any suitable techniques.

Positioning flex circuit 354 relative to circuit board 300 as illustrates in FIG. 4 forms electromagnetic coupler 160 with dielectric 166 between conductive lines 311–316 and 361–366, respectively, formed by the combination of dielectric layer 340 of circuit board 300, any ambient material such as air between flex circuit 354 and circuit board 300, and dielectric layer 390 of flex circuit 354.

Circuit board 300 for another embodiment may be manufactured without dielectric layer 340. Dielectric 166 may then be formed by the combination of dielectric layer 390 and any ambient material between flex circuit 354 and circuit board 300. Flex circuit 354 for another embodiment may be manufactured without dielectric layer 390. Dielectric 166 may then be formed by the combination of dielectric layer 340 and any ambient material between flex circuit 354 and circuit board 300. Where circuit board 300 does not comprise dielectric layer 340 and where flex circuit 354 does not comprise dielectric layer 390, dielectric 166 may be formed by ambient material between flex circuit 354 and circuit board 300.

For one embodiment, a compliant liquid or gel dielectric material, such as a glycerine for example, may be used between flex circuit 354 and circuit board 300 to form at least a portion of dielectric 166. Such material may help fill any ambient space between flex circuit 354 and circuit board 300 and help provide dielectric consistency. For one embodiment where flex circuit 354 is to be fixed to circuit board 300, a suitable adhesive dielectric material, such as an acrylic or epoxy for example, may be used to couple flex circuit 354 to circuit board 300 and form at least a portion of dielectric 166.

Circuit board 300 and flex circuit 354 may have conductive lines with any suitable shape, dimensions, and spacings.

Conductive lines for flex circuit 354 for one embodiment are relatively straight. For another embodiment, as illustrates in FIG. 5, flex circuit 354 has lattice shaped conductive lines, such as conductive lines 361 and 362 for example, that are each formed from multiple connected segments generally lying in a plane with adjacent segments arranged with an alternating angular displacement about the longitudinal axis of the conductive line. Such lines for one embodiment each has a width of approximately 0.010 inches and segments approximately 0.0492 inches in length along the longitudinal axis of the conductive line and angled at an approximately 35 degree angle relative to the longitudinal axis of the conductive line.

Conductive lines for circuit board 300 for one embodiment are relatively straight. For another embodiment, circuit board 300 has lattice shaped conductive lines that are each formed from multiple connected segments generally lying in a plane with adjacent segments arranged with an alternating angular displacement about the longitudinal axis of the conductive line. For one embodiment where flex circuit 354 has lattice shaped conductive lines, conductive line segments for circuit board 300 are arranged with an alternating angular displacement in an opposite sense from corresponding conductive line segments of flex circuit 354. Such lines for one embodiment each has a width of approximately 0.008 inches and segments approximately 0.0492 inches in length along the longitudinal axis of the conductive line and angled at an approximately 35 degree angle relative to the longitudinal axis of the conductive line.

Using lattice shaped conductive lines for flex circuit 354 and circuit board 300 helps allow conductive lines of flex circuit 354 to be positioned relative to corresponding conductive lines of circuit board 300 with a relatively uniform coupling area at overlap locations and helps minimize any impact on the desired coupling coefficient for electromagnetic coupler 160 despite some misalignment. For one embodiment where conductive lines for flex circuit 354 and circuit board 300 are relatively straight, corresponding conductive lines in each pair to be electromagnetically coupled may each have a different width to help compensate for any misalignment.

Although described as comprising flex circuit 354 to form electromagnetic couplers 160, 170, and 180 with circuit board 300, each device 120, 130, and 140 may comprise any suitable carrier to help support bus 122, 132, and 142, respectively, for positioning relative to any suitable carrier supporting bus 112. As examples, each device 120, 130, and 140 may support bus 122, 132, and 142 with a relatively rigid circuit board to position relative to a relatively rigid circuit board supporting bus 112 or to a flex circuit supporting bus 112. Each device 120, 130, and 140 may also support bus 122, 132, and 142 with a flex circuit to position relative to a flex circuit supporting bus 112.

CLAMP

Flex circuit 354 for one embodiment is conductively coupled to circuit board 352 such that one end of each conductive line for flex circuit 354 is conductively coupled to communication circuitry on circuit board 352 to transmit and receive signals and such that the other end of each such conductive line is terminated on circuit board 352. For one embodiment where flex circuit 354 includes voltage reference layer 380, voltage reference layer 380 may be conductively coupled to a reference voltage on circuit board 352. Flex circuit 354 may be mechanically and conductively coupled to circuit board 352 in any suitable manner.

Figure 6:
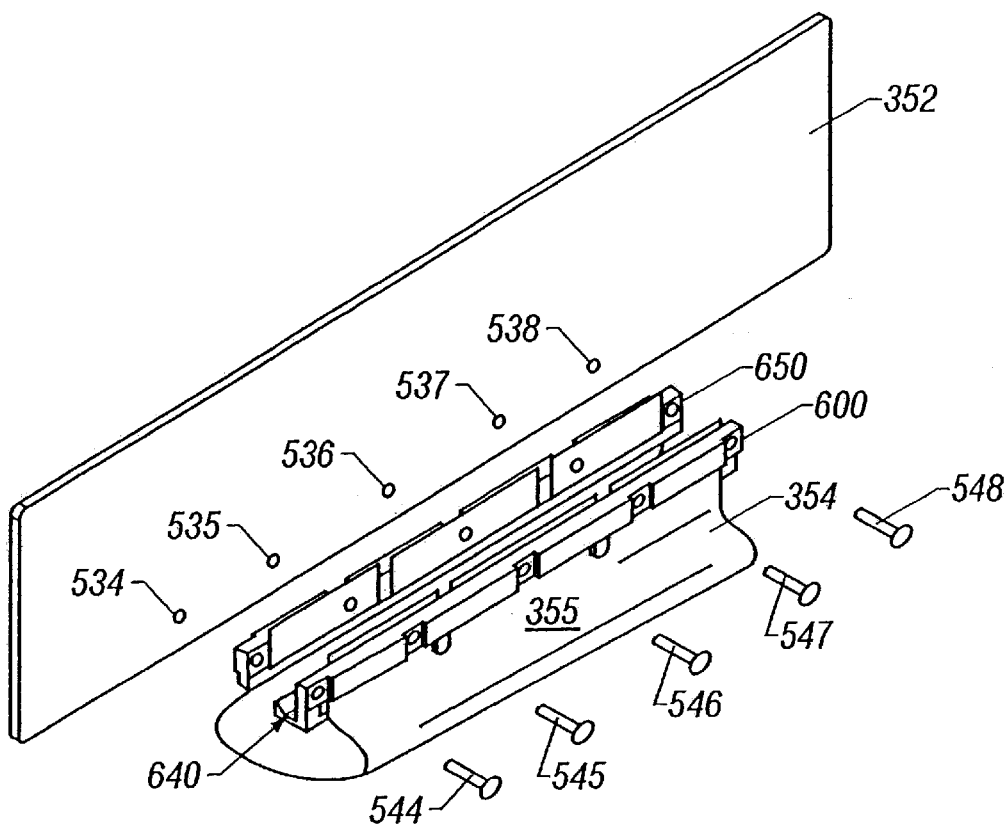
FIG. 6 illustrates, for one embodiment, an exploded perspective view of the device of FIG. 3.
Figure 7:
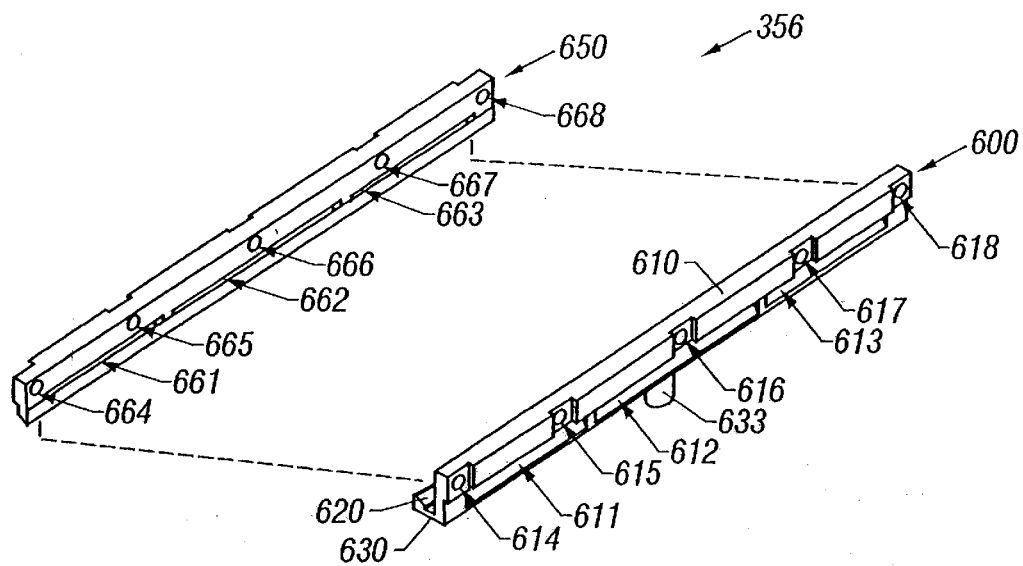
FIG. 7 illustrates for one embodiment, an exploded perspective view of the top and one side of a clamp to clamp a flex circuit to a circuit board.
Figure 8:
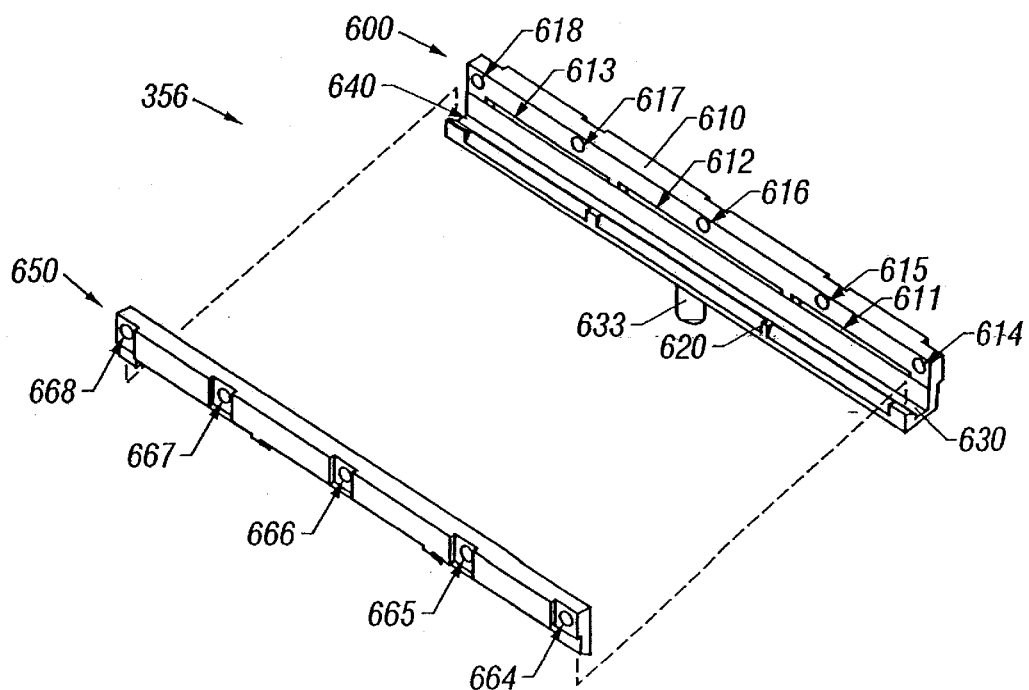
FIG. 8 illustrates, for one embodiment, an exploded perspective view of the top and another side of the clamp of FIG. 7.
Figure 9:
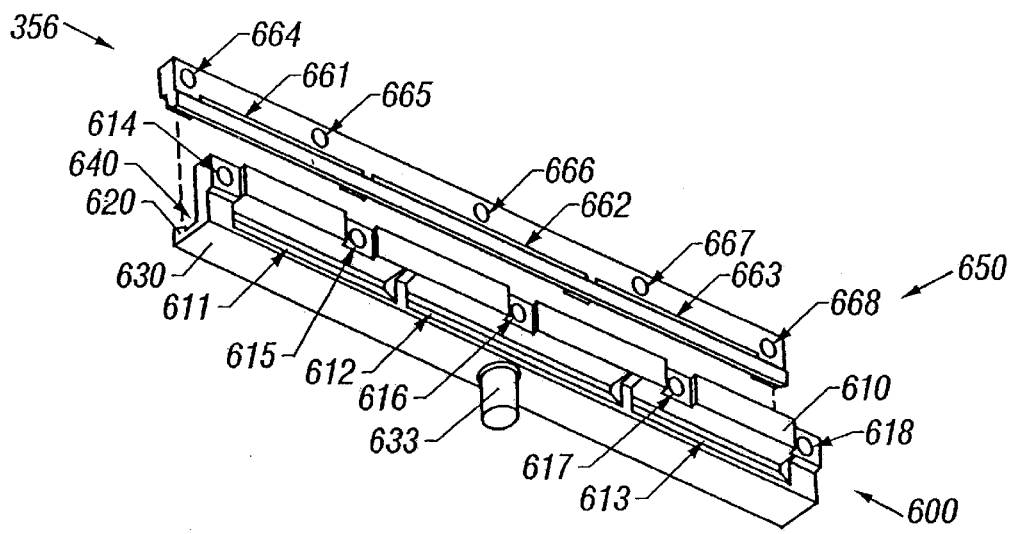
FIG. 9 illustrates, for one embodiment, an exploded perspective view of the bottom and one side of the clamp of FIG. 7.
Figure 10:
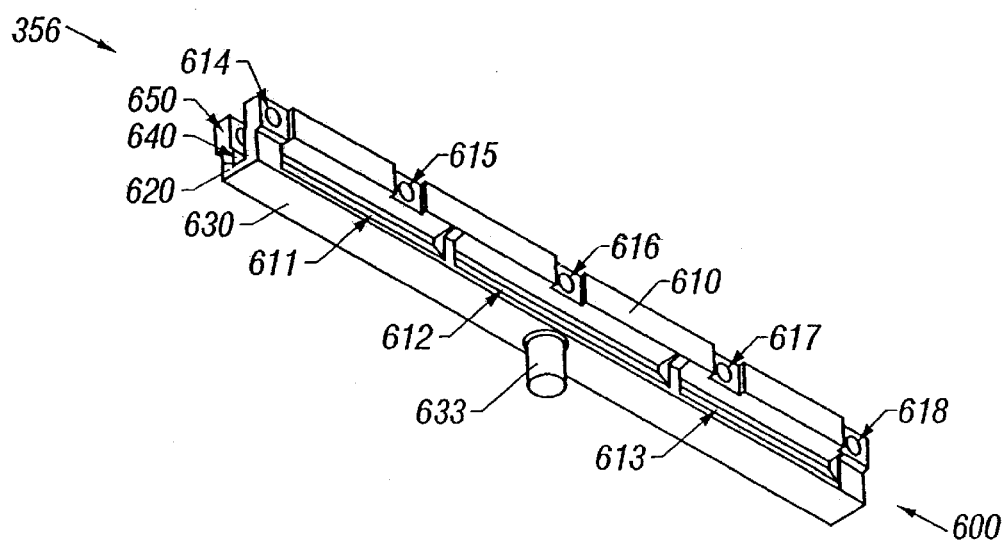
FIG. 10 illustrates, for one embodiment, a perspective view of the clamp of FIG. 7.

For one embodiment, as illustrates in FIGS. 3 and 6, flex circuit 354 is mechanically secured to circuit board 352 using clamp 356. Clamp 356 engages a bottom edge of circuit board 352 and mechanically secures opposite ends 510 and 520 of flex circuit 354 to opposite surfaces of circuit board 352. In securing flex circuit 354 to circuit board 352, clamp 356 helps support flex circuit 354 for stress relief for conductive coupling to circuit board 352 and helps align circuit board 352 relative to circuit board 300 in electromagnetically coupling device 350 to circuit board 300.

Clamp 356, as illustrates in FIGS. 6, 7, 8, 9, and 10, comprises two elongated pieces 600 and 650. Piece 600 defines a wall 610 along one side of piece 600, a raised edge 620 along the other side of piece 600, and a bottom wall 630. Wall 610, raised edge 620, and bottom wall 630 define a channel 640. The bottom of piece 650 mates with the top of raised edge 620, as illustrates in FIG. 10, to form a body for clamp 356. When mated with piece 600, piece 650 forms a wall opposite wall 610 from channel 640. A bottom edge of circuit board 352 may be inserted into channel 640, as illustrates in FIG. 6, such that wall 610 and the wall defined by piece 650 face opposite surfaces of circuit board 352.

Piece 600 defines along wall 610 slots 611, 612, and 613 each extending through wall 610 near the bottom of wall 610 and openings 614, 615, 616, 617, and 618 each extending through wall 610 near the top of wall 610. Piece 650 similarly defines slots 661, 662, and 663 and openings 664, 665, 666, 667, and 668.

Pieces 600 and 650 may each comprise any suitable material, such as an injection molded plastic for example, and may have any suitable dimensions. For one embodiment, piece 600 is approximately 2.844 inches in length, approximately 0.228 inches in width, and approximately 0.254 inches in height. Piece 650 for one embodiment is approximately 2.844 inches in length, approximately 0.112 inches in width, and approximately 0.228 inches in height. Mated pieces 600 and 650 may optionally be bound together using, for example, a suitable epoxy adhesive. Clamp 356 for another embodiment may have one integral body shaped as mated pieces 600 and 650.

Figure 5:
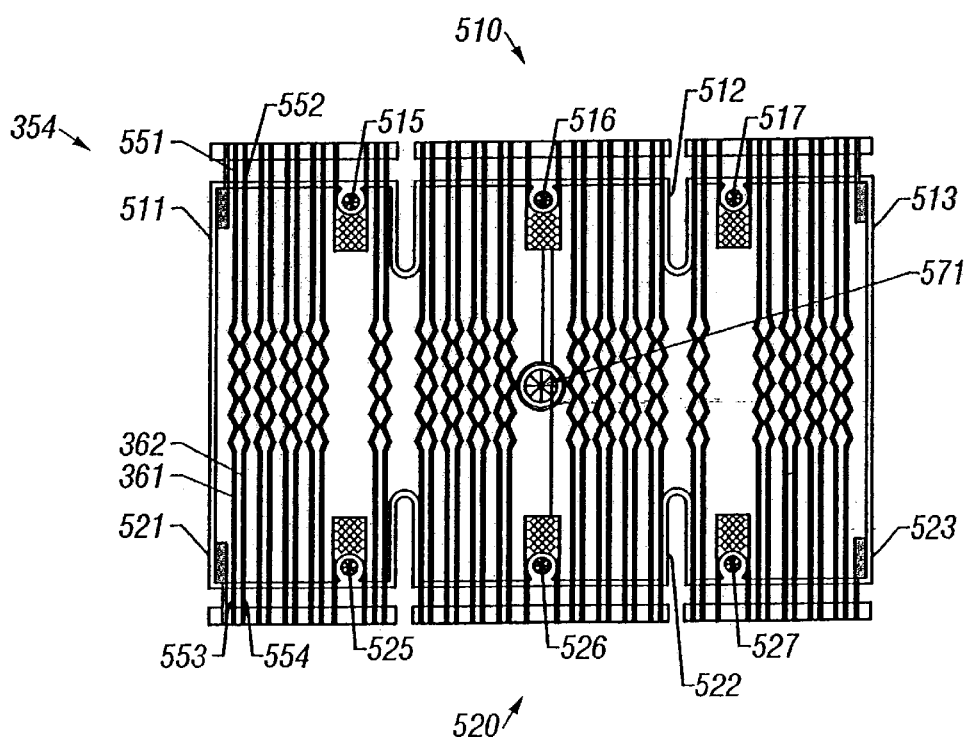
FIG. 5 illustrates, for one embodiment, a flex circuit.

As illustrates in FIG. 5, flex circuit 354 for one embodiment defines tabs 511, 512, and 513 and openings 515, 516, and 517 along one end 510 of flex circuit 354. Flex circuit 354 defines tabs 521, 522, and 523 and openings 525, 526, and 527 along an opposite end 520 of flex circuit 354. Flex circuit 354 may have any suitable dimensions. For one embodiment, flex circuit 354 is approximately 2.586 inches in length and approximately 1.828 in width.

To secure flex circuit 354 to circuit board 352, flex circuit 354 is rolled such that ends 510 and 520 are folded in toward the center of flex circuit 354 and away from the resulting curled surface of flex circuit 354, as illustrates in FIG. 6, such that dielectric layer 390 of flex circuit 354 defines an outer curled surface 355. Tabs 511, 512, and 513 are inserted through slots 611, 612, and 613, respectively, such that each tab 511, 512, and 513 extends from the exterior of wall 610 through slot 611, 612, and 613, respectively, to lie against the interior face of wall 610 and such that each opening 515, 516, and 517 of flex circuit 354 aligns with each opening 615, 616, and 617 of wall 610. Tabs 521, 522, and 523 are similarly inserted through slots 661, 662, and 663, respectively, such that each tab 521, 522, and 523 extends from the exterior of the wall defined by piece 650 through slot 661, 662, and 663, respectively, to lie against the interior face of the wall defined by piece 650 and such that each opening 525, 526, and 527 of flex circuit 354 aligns with each opening 665, 666, and 667 of the wall defined by piece 650.

Circuit board 352 defines openings 534, 535, 536, 537, and 538 that align with openings 614–618, respectively, and with openings 664–668, respectively, when circuit board 352 is inserted into clamp 536. Openings 534–538 each extend through circuit board 352 between opposite surfaces of circuit board 352.

When circuit board 352 and flex circuit 354 are inserted into clamp 356, clamp 356 and flex circuit 354 may be secured to circuit board 352 by inserting screws or rivets 544, 545, 546, 547, and 548 through the aligned openings of clamp 356, flex circuit 354, and circuit board 352. For other embodiments, any other suitable fasteners, such as heat stake pins for example, may be inserted through the aligned openings to secure clamp 356 and flex circuit 354 to circuit board 352. Suitable fasteners may also be integrated with clamp 356. For one embodiment, screws, rivets, or heat stake pins, for example, may be molded or otherwise integrated with piece 600 and/or piece 650 to insert through aligned openings in flex circuit 354, circuit board 352, and opposite piece 600 or 650.

Although described as using three slots to receive three tabs at each end of flex circuit 354 and as using five openings to secure flex circuit 354 to circuit board 352 with five screws or rivets, any suitable number of slots, tabs, and openings may be used.

Figure 11:
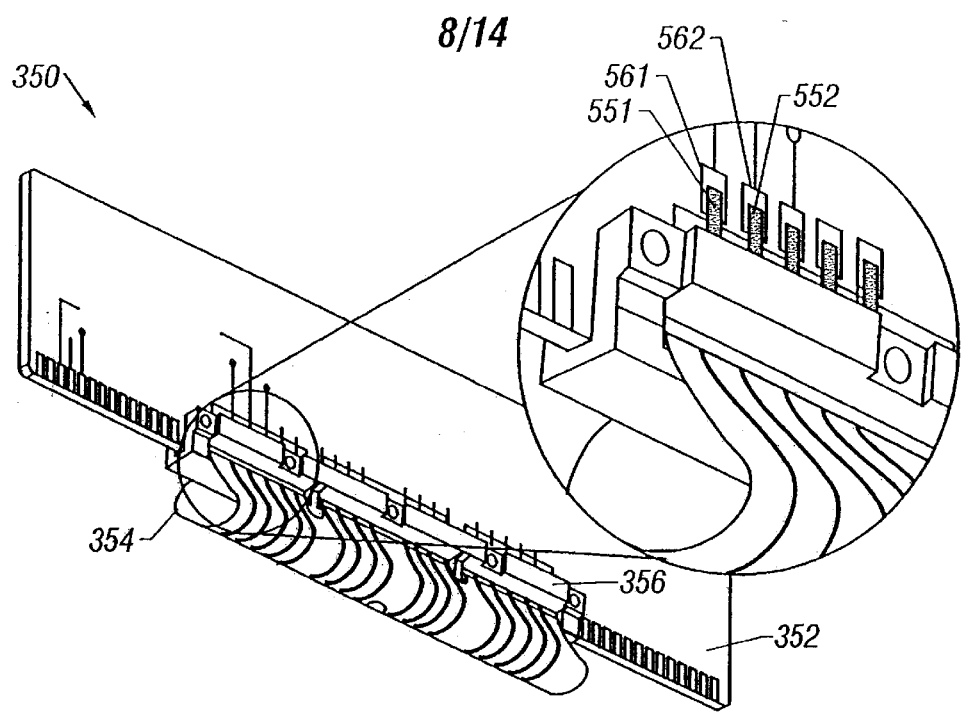
FIG. 11 illustrates, for one embodiment, an electrical coupling of a flex circuit to a circuit board.

As illustrates in FIG. 5, flex circuit 354 for one embodiment comprises exposed leads, such as leads 551 and 552 for example, for each conductive line at each end 510 and 520 of flex circuit 354. Circuit board 352 for one embodiment, as illustrates in FIG. 11, defines contact areas, such as contact areas 561 and 562 for example, that align with such leads when flex circuit 354 is secured to circuit board 352. Such contact areas on one surface of circuit board 352 are conductively coupled to electronic circuitry on circuit board 352, and such contact areas on the other surface of circuit board 352 are conductively coupled to terminate a respective conductive line of flex circuit 354 on circuit board 352. Leads of flex circuit 354 may each be conductively coupled to a respective contact area in any suitable manner, such as using a hot bar soldering technique or using a suitable epoxy adhesive for example.

As ends 510 and 520 of rolled flex circuit 354 may tend to pull away from circuit board 352 due to the resiliency of flex circuit 354, clamp 356 helps secure at least a portion of flex circuit 354 against circuit board 352. In this manner, any tendency of flex circuit 354 to move the secured portion away from circuit board 352 and pull leads of flex circuit 354 from contact areas of circuit board 352 is minimized or avoided.

As illustrates in FIGS. 7–10, clamp 356 for one embodiment defines an optional alignment pin or post 633 extending outward from bottom wall 630. As flex circuit 354 is positioned against circuit board 300, as illustrates in FIG. 12, alignment post 633 may be inserted through an opening 571 in flex circuit 354, as illustrates in FIG. 5, and into an opening 575 in circuit board 300 to help align conductive lines of flex circuit 354 relative to conductive lines of circuit board 300. For another embodiment, clamp 356 may define two or more alignment pins or posts to engage corresponding openings in flex circuit 354 and circuit board 300.

Flex circuit 354 for other embodiments may be secured to circuit board 352 in other suitable manners. As examples, flex circuit 352 may be epoxied, screwed, riveted, or stapled directly to circuit board 352. Leads of flex circuit 354 may then be conductively coupled to a respective contact area of circuit board 352, for example, with solder or epoxy. For other embodiments, flex circuit 354 may be integrally formed with circuit board 352 or a chip on flex arrangement having a relatively rigid stiffener board may be used.

SOCKET

Circuit board 352 and flex circuit 354 may be positioned relative to circuit board 300 and coupled to circuit board 300 in any suitable manner using any suitable mechanism to form an electromagnetic coupler. For one embodiment, as illustrates in FIGS. 13 and 14, a socket 700 may be used to mount circuit board 352 and flex circuit 354 relative to circuit board 300 to form an electromagnetic coupler. While circuit board 352 and flex circuit 354 are mounted by socket 700, the resilience of flex circuit 354 helps hold flex circuit 354 against circuit board 300 and therefore helps maintain a relatively stable coupling coefficient for the resulting electromagnetic coupler. In mounting circuit board 352 and flex circuit 354 to circuit board 300, socket 700 helps align circuit board 352 relative to circuit board 300 and helps align flex circuit 354 relative to circuit board 300. Socket 700 for one embodiment also electrically couples circuit board 352 to circuit board 300.

As illustrates in FIGS. 13, 14, 15, 16, 17, 18, 19, and 20, socket 700 comprises a base 710 near the bottom of socket 700 and arms 730 and 740 extending from base 710 toward the top of socket 700 at opposite ends of base 710.

Base 710 comprises a body 711 defining walls 712 and 713 on opposite sides of base 710 and adjacent to a coupler region 715 between walls 712 and 713. Base 710 also comprises connectors 750 and 760 supported on opposite ends of coupler region 715 at opposite ends of base 710. Connectors 750 and 760 mount circuit board 352 to base 710 such that flex circuit 354 is inserted into coupler region 715. Connectors 750 and 760 also mount base 710 to circuit board 300 such that flex circuit 354 is mounted relative to circuit board 300 to form an electromagnetic coupler. Connectors 750 and 760 for one embodiment also electrically couple circuit board 352 to circuit board 300.

As illustrates in FIGS. 13, 15, 18, and 20, connectors 750 and 760 for one embodiment each comprise an edge connector facing the top of socket 700. Circuit board 352 may be removably mounted to base 710 by inserting a bottom edge of circuit board 352 into the edge connector of connectors 750 and 760.

Figure 13:
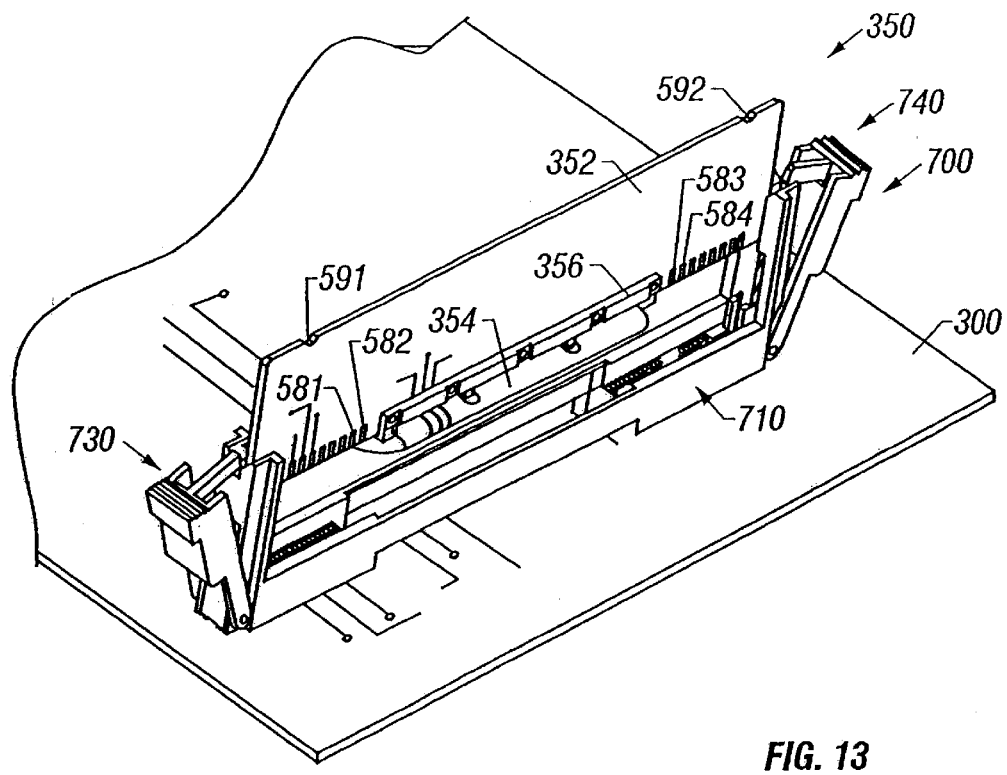
FIG. 13 illustrates, for one embodiment, a perspective view of a device positioned for insertion into a socket to secure the device relative to a circuit board to form an electromagnetic coupler.
Figure 14:
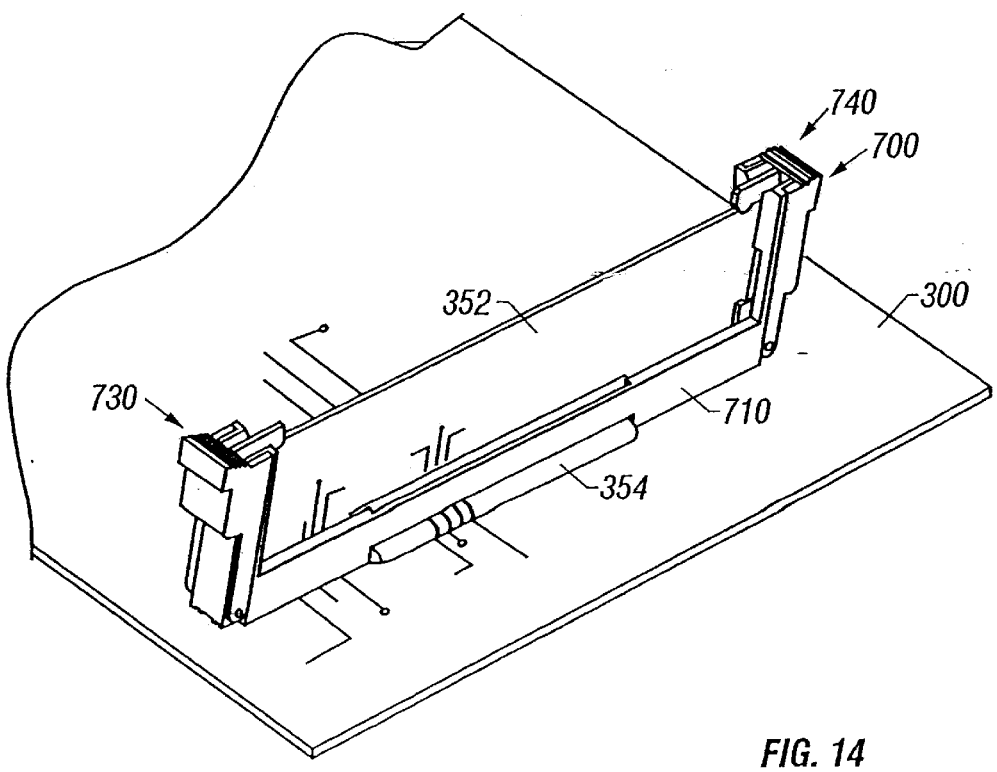
FIG. 14 illustrates, for one embodiment, a perspective view of the socket of FIG. 13 securing the device relative to the circuit board.

Circuit board 352 for one embodiment has contact areas, such as contact areas 581, 582, 583, and 584 of FIG. 13 for example, conductively coupled to circuitry on circuit board 352 and positioned along the bottom edge of circuit board 352 on opposite sides of clamp 356 such that each such contact area is electrically coupled to connector 750 or connector 760 when circuit board 352 is mounted to connectors 750 and 760.

Figures 15, 16:
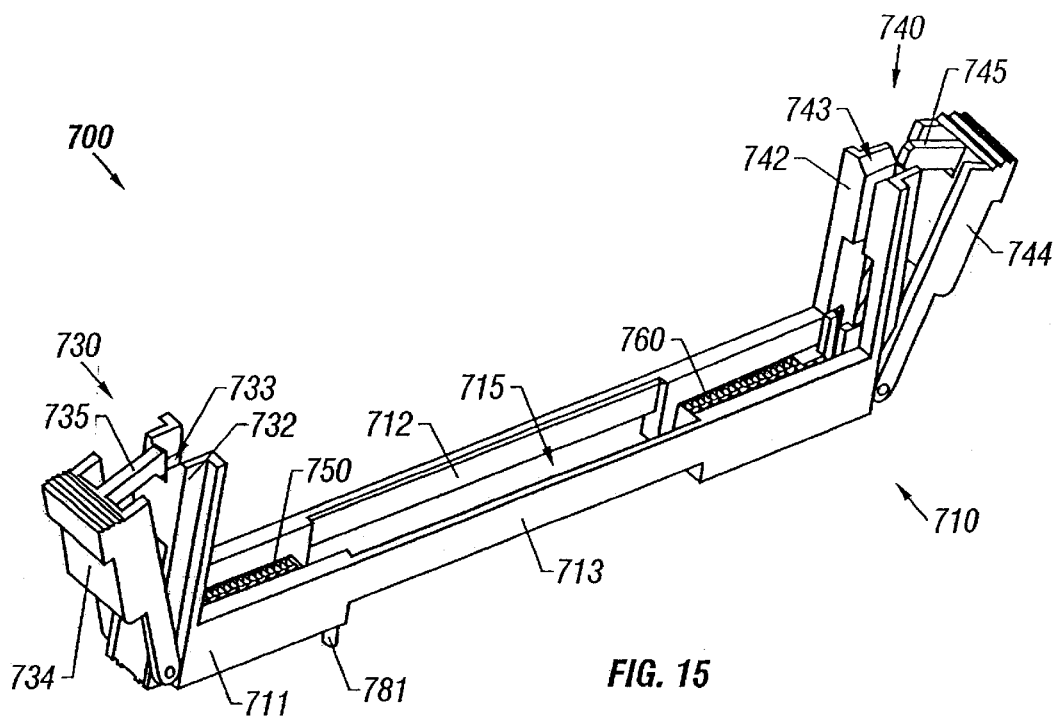
FIG. 15 illustrates, for one embodiment, a perspective view of a top and one side of the socket of FIG. 13
FIG. 16 illustrates, for one embodiment, a perspective view of a bottom and one side of the socket of FIG. 13
Figure 17:
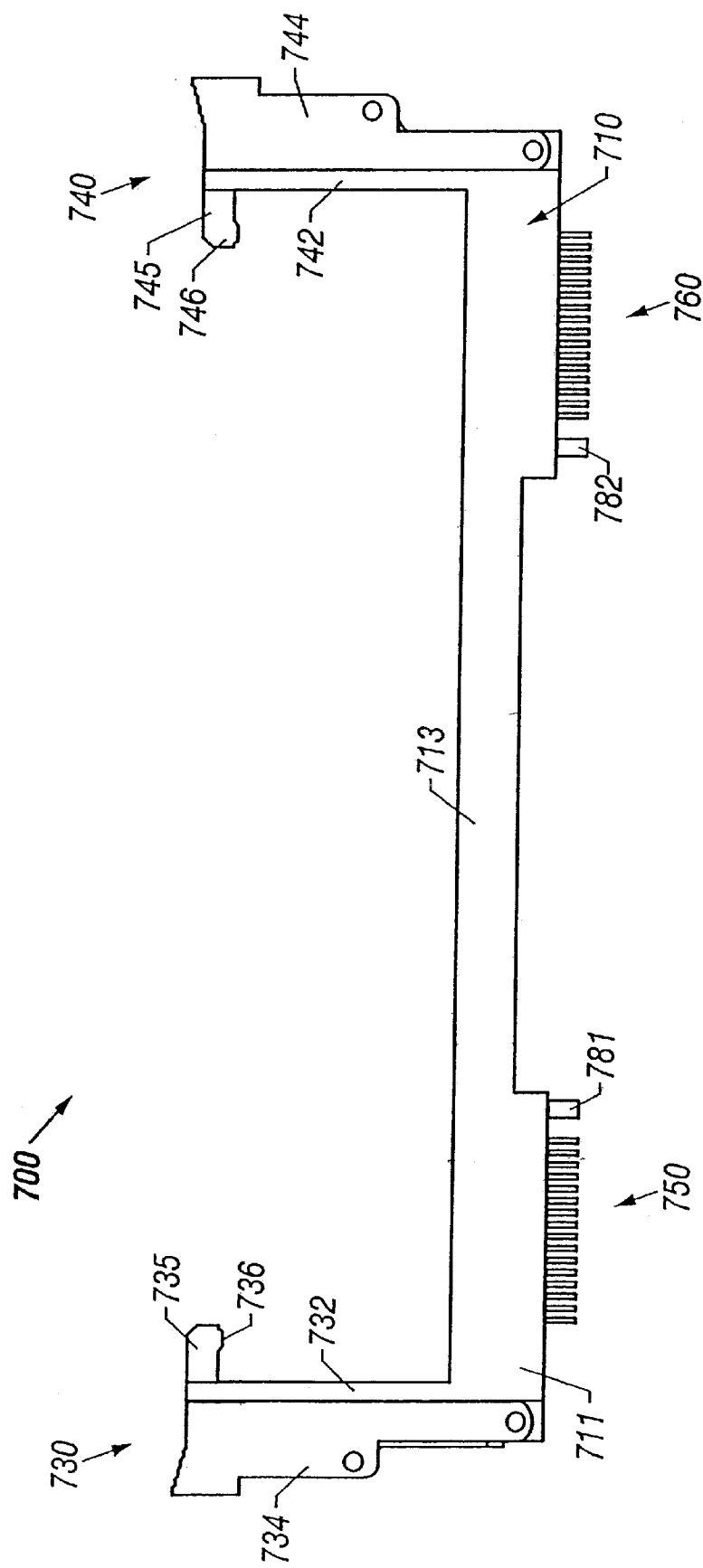
FIG. 17 illustrates, for one embodiment, an elevational view of one side of the socket of FIG. 13.
Figure 18:
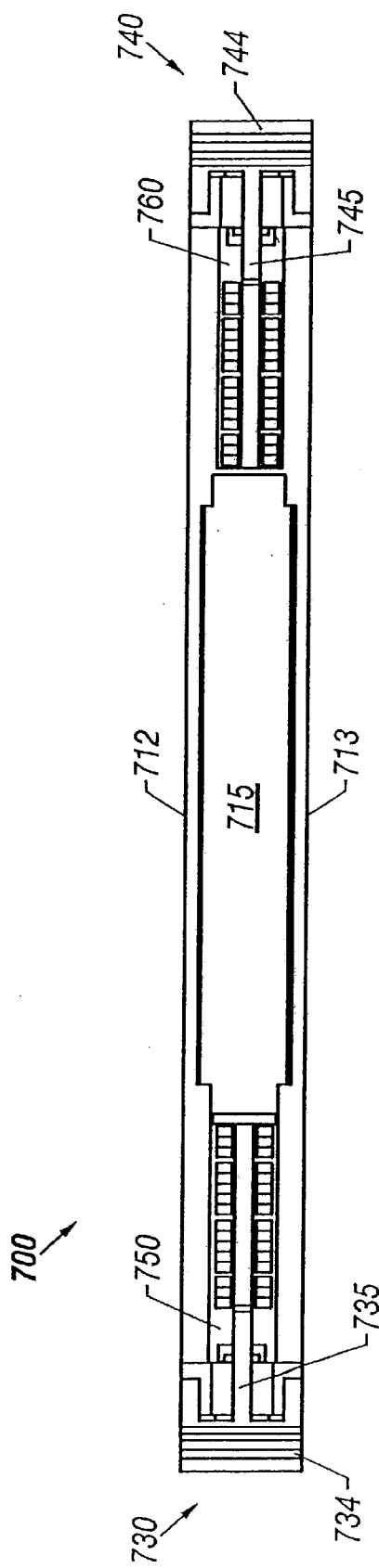
FIG. 18 illustrates, for one embodiment, a plan view of a top of the socket of FIG. 13.
Figure 19:
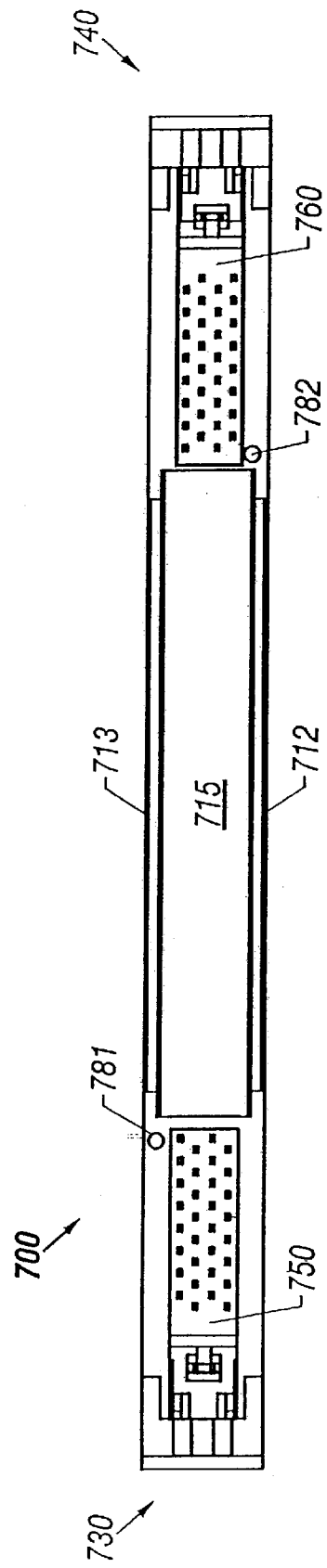
FIG. 19 illustrates, for one embodiment, a plan view of a bottom of the socket of FIG. 13.
Figure 20:
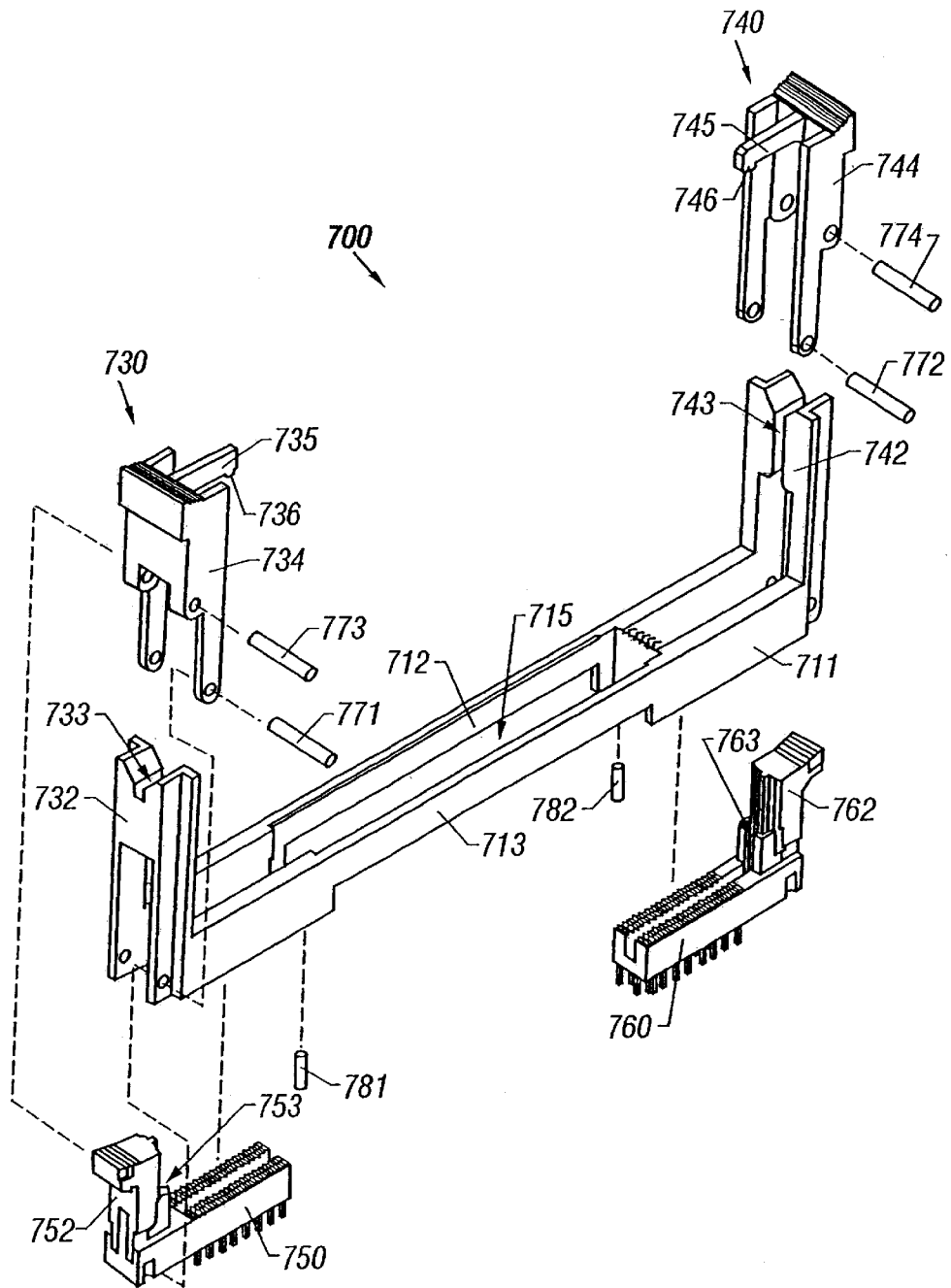
FIG. 20 illustrates, for one embodiment, an exploded perspective view of a top and one side of the socket of FIG. 13.

Connectors 750 and 760 for one embodiment, as illustrates in FIGS. 16, 17, 19, and 20, each comprise contact pins, such as contact pins 751, 752, 761, and 762 of FIG. 16 for example, extending outward from the bottom of base 710. Base 710, and therefore socket 700, may be removably mounted to circuit board 300 by inserting the contact pins of connectors 750 and 760 into respective female connectors positioned on circuit board 300 such that conductive lines of flex circuit 354, when mounted in coupler region 715, are positioned relative to conductive lines on circuit board 300 to form an electromagnetic coupler.

Socket 700 for one embodiment, as illustrates in FIGS. 15, 16, 17, 19, and 20, also comprises optional locating and hold-down pins 781 and 782 each extending from the bottom of body 711 for insertion into corresponding openings of circuit board 300 to help align base 710 relative to circuit board 300 and to help secure base 710 to circuit board 300.

Circuit board 300 for one embodiment comprises circuitry conductively coupled to such female connectors. As connectors 750 and 760 for one embodiment electrically couple the bottom edge contact areas of circuit board 352 to the contact pins of connectors 750 and 760, connectors 750 and 760 electrically couple circuit board 352 to circuit board 300 when base 710 is mounted to circuit board 300. In this manner, power signals, voltage reference signals, any other suitable direct current (DC) signals, and/or any other suitable signals may be supplied between circuit board 352 and circuit board 300.

Although described as comprising connectors 750 and 760 as having edge connectors and contact pins, other suitable connectors may be used for mechanically mounting circuit board 352 to base 710 and base 710 to circuit board 300 and for electrically coupling circuit board 352 to circuit board 300. As one example, banana jack connectors may be used instead of edge connectors. For another embodiment, high current mated pair connectors or impedance controlled mated pair connectors may be used.

Socket 700 for another embodiment may not provide for any electrical coupling of circuit board 352 to circuit board 300. Connectors 750 and 760 may then comprise any suitable mechanical connectors without concern for electrical coupling through connectors 750 and 760. In addition to or in lieu of any electrical coupling of circuit board 352 to circuit board 300 provided through connectors 750 and 760, circuit board 352 may be electrically coupled to circuit board 300 through flex circuit 354, for example, by coupling exposed conductive contact areas on flex circuit 354 and circuit board 300 in securing flex circuit 354 against circuit board 300.

Arms 730 and 740 secure circuit board 352 and flex circuit 354 relative to circuit board 300. As illustrates in FIGS. 15–20, arms 730 and 740 each comprise an upright guide 732 and 742, respectively, and a latch 734 and 744, respectively.

Upright guides 732 and 742 each engage circuit board 352 to help support circuit board 352 relative to circuit board 300 and to help minimize any angular displacement of circuit board 352 relative to circuit board 300. Upright guides 732 and 742 for one embodiment extend from base 710 toward the top of socket 700 at opposite ends of base 710 and define slots 733 and 743, respectively, facing inward toward coupler region 715. In mounting circuit board 352 to base 710, opposite side edges of circuit board 352 are inserted into slots 733 and 743. For another embodiment, upright guides 732 and 734 may engage circuit board 352 in any other suitable manner. Although illustrates as being integrally formed with body 711, upright guides 732 and 742 for another embodiment may each be a separate component connected to base 710 in any suitable manner. For yet another embodiment, socket 700 may not have upright guides 732 and 734.

Latches 734 and 744 each engage circuit board 352 to help secure flex circuit 354 against circuit board 300. Because of the shape and resiliency of flex circuit 354, flex circuit 354 exerts a force against latches 734 and 744 as well as against circuit board 300 when circuit board 352 and flex circuit 354 are mounted to circuit board 300 with socket 700. Latches 734 and 744 therefore help maintain a relatively stable coupling coefficient for the resulting electromagnetic coupler. Latches 734 and 744 may exert any suitable amount of force against flex circuit 354, such as approximately 10 to approximately 20 pounds of normal force for example.

Latches 734 and 744 for one embodiment are pivotably mounted at opposite ends of base 710 such that each latch 734 and 744 may be pivoted inward toward coupler region 715 to engage circuit board 352 and outward from coupler region 715 to disengage circuit board 352. For one embodiment, as illustrates in FIG. 20, latches 734 and 744 are pivotably mounted to base 710 and connectors 750 and 760, respectively, by pins 771 and 772, respectively, and to pivoting guides 752 and 762, respectively, of connectors 750 and 760, respectively, with pins 773 and 774, respectively, to help align latches 734 and 744 relative to connectors 750 and 760, respectively, and to circuit board 352.

Pivoting guides 752 and 762 each engage circuit board 352 when latching circuit board 352 with latches 734 and 744 to help support circuit board 352 relative to circuit board 300 and to help align circuit board 352, when mounted in base 710, with latches 734 and 744. Pivoting guides 752 and 762 for one embodiment extend toward the top of socket 700 at opposite ends of base 710 and define slots 753 and 763, respectively, facing inward toward coupler region 715. Pivoting guides 752 and 762 pivot with latches 734 and 744, respectively. Slots 753 and 763 engage opposite side edges of circuit board 352 when circuit board 352 is mounted in base 710 and when latches 734 and 744 are pivoted inward to latch circuit board 352. For another embodiment, pivoting guides 752 and 762 may engage circuit board 352 in any other suitable manner. Although illustrates as a portion of each connector 750 and 760, pivoting guides 752 and 762 for another embodiment may each form a portion of latches 734 and 744, respectively, or may each be a separate component connected to socket 700 in any suitable manner.

Latches 734 and 744 for one embodiment each define a finger 735 and 745, respectively, extending inward toward coupler region 715. Fingers 735 and 745 each define a knob 736 and 746, respectively, at their respective ends to engage respective notches or indentations 591 and 592 at a top edge of circuit board 352, as illustrates in FIG. 13, when circuit board 352 is mounted in base 710 and when latches 734 and 744 are pivoted inward. Fingers 735 and 745 therefore secure circuit board 352 and flex circuit 354 against circuit board 300. For another embodiment, latches 734 and 744 may engage circuit board 352 in any other suitable manner. As one example, fingers 735 and 745 may each engage a notch or indentation in opposite side edges of circuit board 352.

While circuit board 352 and flex circuit 354 are mounted to circuit board 300 by socket 700, walls 712 and/or 713 may help support flex circuit 354 relative to circuit board 300 despite any tendency by flex circuit 354 to roll to one side due to its shape and the force exerted on flex circuit 354 against circuit board 300 by latches 734 and 744. Walls 712 and/or 713 may therefore help align conductive lines of flex circuit 354 relative to conductive lines of circuit board 300. For another embodiment, each interior face of wall 712 and/or 713 may be contoured in a relatively concave manner, for example, to help support the rolled shape of flex circuit 354 and help align flex circuit 354 relative to circuit board 300. Although illustrates as walls 712 and 713, socket 700 for another embodiment may comprise one or more guide rails of any other suitable shape, such as rods for example, to help support flex circuit 354. Socket 700 for another embodiment may comprise only one or no guide rail adjacent to coupler region 715.

Figure 12:
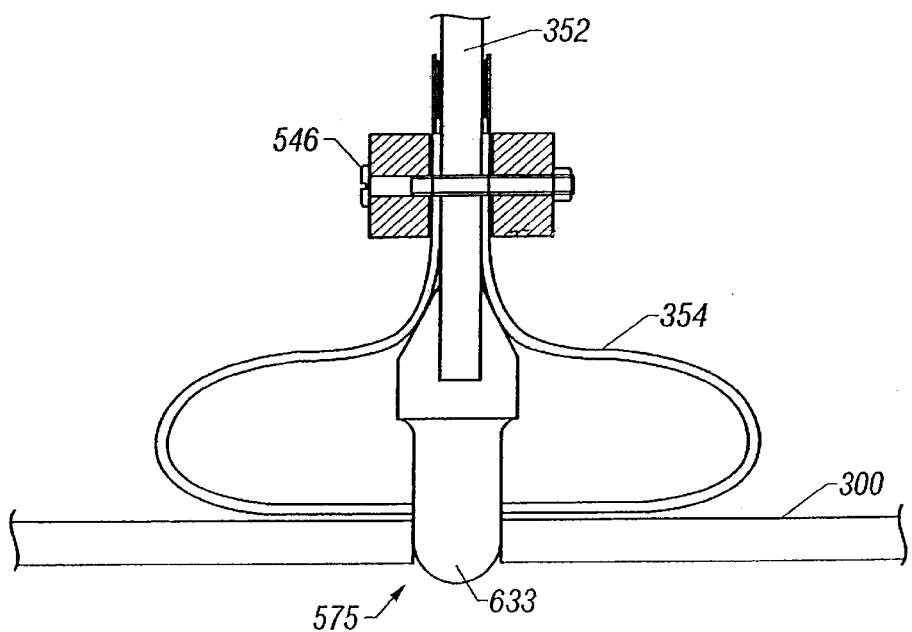
FIG. 12 illustrates, for one embodiment, a partial cross-sectional view of a device electromagnetically coupled to a circuit board.

In addition to or in lieu of the use of walls 712 and/or 713 and/or alignment post 633, as illustrates in FIG. 12, to help align flex circuit 354 relative to circuit board 300, one or more other suitable alignment techniques may be used. As one example, flex circuit 354 may be defined with one or more notches or indentations along one or each side of flex circuit 354 to engage corresponding guide pins or tabs at one or both opposite ends of coupler region 715. Such guide pins or tabs may extend from socket 700 inward toward coupler region 715 or from circuit board 300 into coupler region 715 when base 710 is mounted to circuit board 300. As another example, one or more guide pins or posts may extend from circuit board 300 into coupler region 715, when base 710 is mounted to circuit board 300, to engage corresponding openings in flex circuit 354. As another example, one or more guide pins or posts may extend from flex circuit 354 into corresponding openings in circuit board 300 when circuit board 352 and flex circuit 354 are mounted to circuit board 300.

To help maintain outer surface 355 of flex circuit 354 against circuit board 300 when circuit board 352 and flex circuit 354 are mounted to circuit board 300, relatively flexible or semi-rigid supports may be placed between the bottom of clamp 356 and the bottom interior surface of flex circuit 354. Such supports may comprise any suitable material, such as foam, rubber, injection molded plastic, and/or an elastomeric material for example, and may be shaped in any suitable manner, such as a brick, as a spring, or as springy fingers for example. In addition to or in lieu of such supports, a relatively springy material may be formed along the interior surface of flex circuit 354 to help maintain outer surface 355 of flex circuit 354 against circuit board 300. As one example, beryllium copper may be laminated along the interior surface of flex circuit 354.

To remove circuit board 352 and flex circuit 354 from socket 700, latches 734 and 744 may be pivoted outward from circuit board 352 to disengage latches 734 and 744 from circuit board 352. Circuit board 352 and flex circuit 354 may then be lifted from socket 700.

Each component of socket 700 may comprise any suitable material and may have any suitable dimensions. Body 711, upright guides 732 and 734, and latches 734 and 744 for one embodiment may each comprise an injection molded plastic, for example. Base 710 for one embodiment is approximately 5.550 inches in length, approximately 0.550 inches in width, and approximately 0.425 inches in height and defines coupler region 715 to be approximately 3.041 inches in length. Upright guides 732 and 742 for one embodiment are each approximately 1.576 inches in height.

Although illustrates as mounted to circuit board 300 with socket 700, circuit board 352 and flex circuit 354 may be mounted to circuit board 300 using other suitable mechanisms. As one example, a single connector and arm, similar to the combination of connector 750 and arm 730 for example, may be used. For another embodiment, a clam shell clamp arrangement may be used to hold a flattened flex circuit 354 against circuit board 300.

Figure 21:
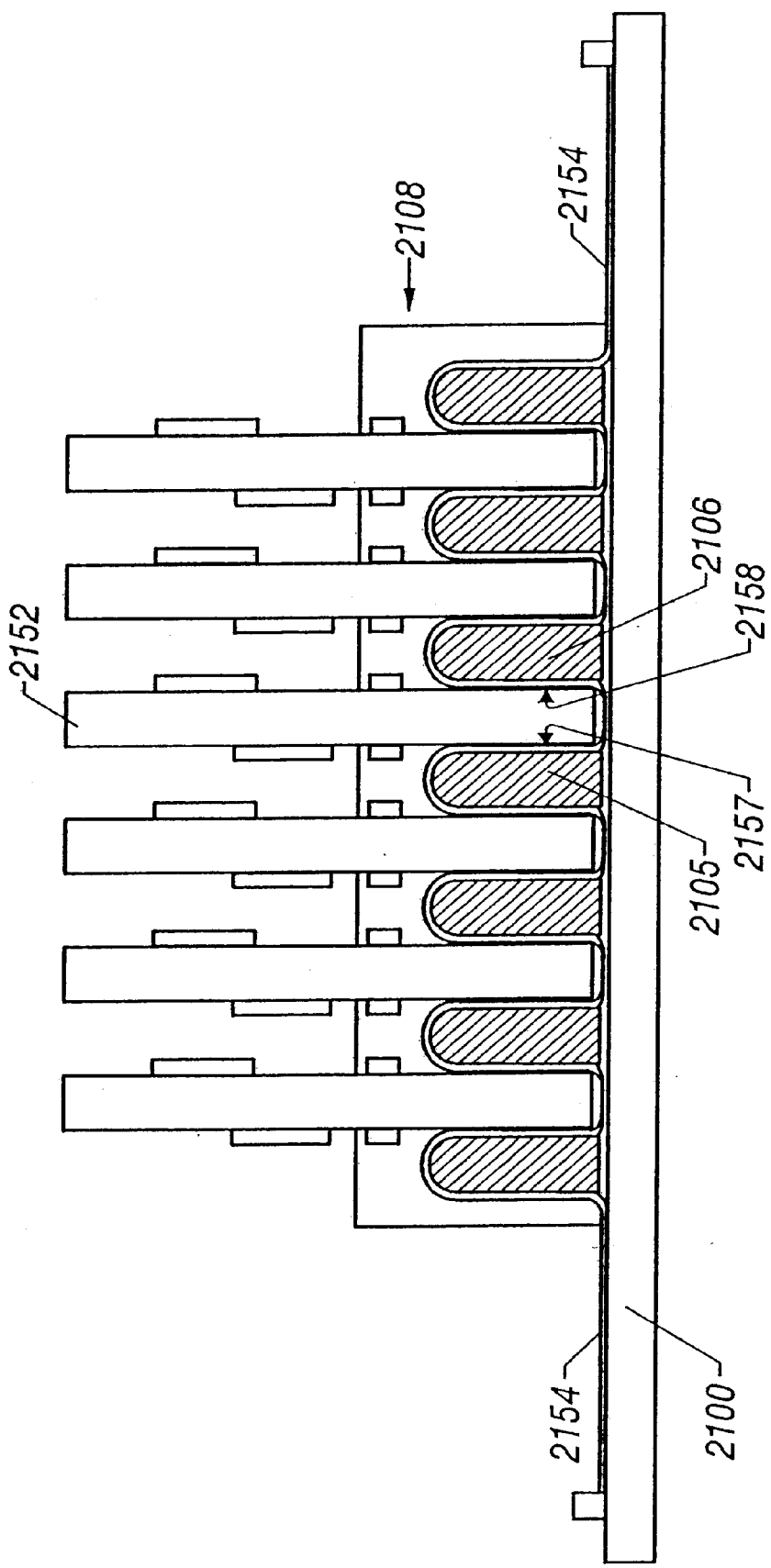
FIG. 21 illustrates for another embodiment, a plurality of devices electromagnetically coupled to a flex circuit of a circuit board.

As illustrates in FIG. 21, a circuit board 2152 for another embodiment may be positioned relative to a flex circuit 2154 of a circuit board 2100 to form an electromagnetic coupler. Flex circuit 2154 comprises one or more conductive lines for bus 112, for example, and may be similarly formed as flex circuit 354. Circuit board 2152 comprises one or more conductive lines for bus 122, for example, that may be similarly formed on circuit board 2152 as conductive lines for circuit board 300, for example.

Conductive lines of flex circuit 2154 are conductively coupled to communication circuitry on circuit board 2100 and may be terminated in flex circuit 2154 or on circuit board 2100. Flex circuit 2154 may be conductively coupled to circuit board 2100 in any suitable manner, such as through surface mount solder pads or a suitable connector for example.

As illustrates in FIG. 21, flex circuit 2154 for one embodiment is folded to form a coupler region 2157. Conductive lines of circuit board 2152 may be positioned relative to coupler region 2157 to form an electromagnetic coupler by positioning a surface of circuit board 2152 relative to coupler region 2157. Circuit board 2152 for another embodiment may comprise other conductive lines for another bus such that positioning an opposite surface of circuit board 2152 relative to a coupler region 2158 of folded flex circuit 2152 forms another electromagnetic coupler. Flex circuit 2154 may be folded to form an electromagnetic coupler with any suitable number of circuit boards, such as six, for example, as illustrates in FIG. 21. Although illustrates as being folded to form an electromagnetic coupler with circuit board 2152 positioned generally perpendicularly relative to circuit board 2100, flex circuit 2154 may be positioned in other suitable manners to form an electromagnetic coupler with circuit board 2152 positioned in other suitable manners.

For one embodiment, suitable flex circuit supports, such as supports 2105 and 2106 for example, may be used to support flex circuit 2154 in a folded position. Such supports may comprise any suitable material. For one embodiment, such supports comprise a suitable resilient material to help hold circuit board 2152 against flex circuit 2154. Also, a suitable circuit board guide 2108 may be used to help support and align one or more circuit boards relative to flex circuit 2154.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A device comprising:
   a circuit board;
   a carrier comprising one or more conductive areas to form a portion of an electromagnetic coupler; and
   a clamp to secure the carrier to the circuit board.

2. The device of claim 1, wherein the carrier comprises a dielectric to form a portion of the electromagnetic coupler.

3. The device of claim 1, wherein the carrier comprises a resilient material and wherein the clamp secures the carrier relative to the circuit board such that at least a portion of the carrier is secured against the circuit board despite any tendency by the carrier to move the secured portion away from the circuit board.

4. The device of claim 1, wherein the clamp secures opposite ends of the carrier to respective opposite surfaces of the circuit board such that the carrier defines an outer curled surface.

5. The device of claim 4, wherein the carrier comprises one or more layers each comprising a dielectric material between each conductive area and the outer curled surface of the carrier.

6. The device of claim 4, wherein the clamp includes a channel in which an edge of the circuit board is inserted in securing the carrier to the circuit board.

7. The device of claim 4, wherein the carrier includes one or more tabs at each end of the carrier and wherein the clamp includes one or more slots each to receive a respective tab of the carrier in securing the carrier to the circuit board.

8. The device of claim 4, wherein the carrier, the circuit board, and the clamp have openings such that a fastener may be inserted through the openings in securing the carrier to the circuit board.

9. The device of claim 4, wherein the carrier and the circuit board have openings such that a fastener integrated with the clamp may be inserted through the openings in securing the carrier to the circuit board.

10. The device of claim 4, wherein the carrier has one or more conductive lines each having a lead to couple to a contact area of the circuit board, wherein a portion of each conductive line forms a respective conductive area.

11. The device of claim 4, wherein the clamp includes a post to insert through an opening in another device in positioning the outer curled surface of the carrier relative to the other device.

12. A clamp comprising:
    a body having a channel to engage an edge of a circuit board having opposite surfaces, the body having slots at each opposite surface, each slot to receive a respective one of a plurality of tabs at an end of a carrier.

13. The clamp of claim 12, wherein the body is formed by two pieces.

14. The clamp of claim 12, wherein the body has an opening for alignment with an opening in the circuit board and an opening in the carrier such that a fastener may be inserted through the aligned openings to secure the carrier to the circuit board.

15. The clamp of claim 12, wherein the body includes a fastener for insertion through an opening in the circuit board and an opening in the carrier.

16. The clamp of claim 12, wherein the body includes a post for insertion through an opening in the carrier and in an opening in a device in positioning the carrier relative to the device.

17. A method comprising:
    securing a carrier to a device with a clamp, the carrier comprising one or more conductive areas to form a portion of an electromagnetic coupler ; and
    curling the carrier to secure opposite ends of the carrier to opposite surfaces of a circuit board with the clamp.

18. The method of claim 17, comprising engaging an edge of the circuit board with the clamp.

19. The method of claim 17, wherein the securing comprises inserting each of one or more tabs at each end of the carrier in a respective slot of the clamp.

20. The method of claim 17, wherein the securing comprises inserting a fastener through aligned openings in the carrier, the circuit board, and the clamp.

21. The method of claim 17, wherein the securing comprises inserting a fastener integrated with the clamp through aligned openings in the carrier and the circuit board.

22. The method of claim 17, comprising coupling leads of the carrier to contact areas of the circuit board.

23. The method of claim 17, comprising positioning the carrier relative to a device to form the electromagnetic coupler.

24. The method of claim 23, wherein the positioning comprises inserting a post of the clamp through an opening in the carrier and in an opening in the device.

25. The method of claim 23, wherein the positioning comprises mounting the carrier to the device with a socket.

26. An apparatus comprising:
(a) a first device comprising:
  (i) a circuit board,
  (ii) a carrier comprising one or more conductive areas to form a portion of an electromagnetic coupler, and
  (iii) a clamp to secure the carrier to the first device; and
(b) a socket to mount the first device relative to a second device to form the electromagnetic coupler.

27. The apparatus of claim 26, wherein the carrier comprises a resilient material and wherein the clamp secures the carrier relative to the first device such that at least a portion of the carrier is secured against the first device despite any tendency by the carrier to move the secured portion away from the first device in mounting the first device relative to the second device.

28. The apparatus of claim 26, wherein the clamp secures opposite ends of the carrier to respective opposite surfaces the circuit board of the first device such that the carrier defines an outer curled surface.

29. An apparatus comprising:
(a) a first device comprising:
  (i) a circuit board,
  (ii) a carrier comprising one or more conductive areas to form a first portion of an electromagnetic coupler, and
  (iii) a clamp to secure the carrier to the circuit board;
(b) a second device having one or more conductive areas to form a second portion of the electromagnetic coupler; and
(c) a socket to mount the first device relative to the second device to form the electromagnetic coupler.

30. The apparatus of claim 29, wherein the carrier comprises a resilient material and wherein the clamp secures the carrier relative to the first device such that at least a portion of the carrier is secured against the first device despite any tendency by the carrier to move the secured portion away from the first device in mounting the first device relative to the second device.

31. The apparatus of claim 29, wherein the first device comprises a circuit board having the component and wherein the clamp secures opposite ends of the carrier to respective opposite surfaces of the circuit board of the first device such that the carrier defines an outer curled surface.

* * * * *

UNITED STATES PATENT AND TRADEMARK OFFICE
CERTIFICATE OF CORRECTION

PATENT NO. : 6,576,847 B2
DATED : June 10, 2003
INVENTOR(S) : Marketkar et al.

It is certified that error appears in the above-identified patent and that said Letters Patent is hereby corrected as shown below:

Column 6,
Line 29, before "layer 340", delete "fief".

Column 18,
Lines 24 and 25, delete "wherein the first device comprises a circuit board having the component and".

Signed and Sealed this

Second Day of December, 2003

JAMES E. ROGAN
*Director of the United States Patent and Trademark Office*